United States Patent
Kobayashi et al.

(10) Patent No.: US 10,174,149 B2
(45) Date of Patent: Jan. 8, 2019

(54) CYANIC ACID ESTER COMPOUND AND METHOD FOR PRODUCING SAME, RESIN COMPOSITION, AND CURED PRODUCT

(71) Applicant: MITSUBISHI GAS CHEMICAL COMPANY, INC., Tokyo (JP)

(72) Inventors: Takashi Kobayashi, Tokyo (JP); Kentaro Takano, Tokyo (JP); Masayuki Katagiri, Niigata (JP); Keita Tokuzumi, Niigata (JP); Tatsuya Shima, Niigata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 15/519,306

(22) PCT Filed: Nov. 24, 2015

(86) PCT No.: PCT/JP2015/082954
§ 371 (c)(1),
(2) Date: Apr. 14, 2017

(87) PCT Pub. No.: WO2016/098533
PCT Pub. Date: Jun. 23, 2016

(65) Prior Publication Data
US 2017/0226263 A1    Aug. 10, 2017

(30) Foreign Application Priority Data

Dec. 18, 2014 (JP) .................. 2014-255801
Dec. 18, 2014 (JP) .................. 2014-255802

(51) Int. Cl.
*C08G 14/12* (2006.01)
*B32B 15/098* (2006.01)
(Continued)

(52) U.S. Cl.
CPC .............. *C08G 14/12* (2013.01); *B32B 5/022* (2013.01); *B32B 7/12* (2013.01); *B32B 15/098* (2013.01);
(Continued)

(58) Field of Classification Search
CPC .. C08G 14/12; C08G 73/0655; B32B 15/098; B32B 15/14; B32B 5/22; B32B 7/12;
(Continued)

(56) References Cited

U.S. PATENT DOCUMENTS 4,709,008 A    11/1987  Shimp
5,223,602 A *  6/1993  Kaji ...................... C08G 18/64
                                                        525/507
(Continued)

FOREIGN PATENT DOCUMENTS

EP    2733177 A    5/2014
JP    2613056      2/1997
(Continued)

OTHER PUBLICATIONS

Sakatani, JP 2000-313737 A machine translation in English, Nov. 14, 2000 (Year: 2000).*

(Continued)

*Primary Examiner* — David T Karst

(74) *Attorney, Agent, or Firm* — Greenblum & Bernstein, P.L.C.

(57) ABSTRACT

The present invention provides a cyanic acid ester compound having a structure represented by the following general formula (1):

(Continued)

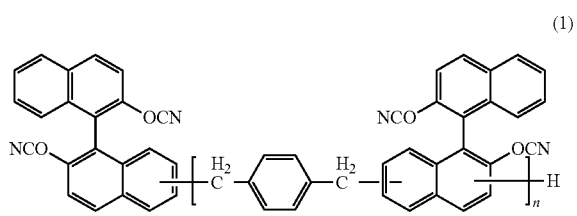

(1)

wherein n represents an integer of 1 or larger.

15 Claims, 2 Drawing Sheets

(51) Int. Cl.
B32B 15/14 (2006.01)
B32B 5/22 (2006.01)
B32B 7/12 (2006.01)
C08G 73/06 (2006.01)
C08L 61/34 (2006.01)
C08L 63/00 (2006.01)
C08J 5/24 (2006.01)
H01L 23/29 (2006.01)
B32B 5/02 (2006.01)

(52) U.S. Cl.
CPC .......... B32B 15/14 (2013.01); C08G 73/0655 (2013.01); C08J 5/24 (2013.01); C08L 61/34 (2013.01); C08L 63/00 (2013.01); H01L 23/29 (2013.01); B32B 2260/046 (2013.01); B32B 2262/0269 (2013.01); B32B 2262/0276 (2013.01); C08J 2361/34 (2013.01)

(58) Field of Classification Search
CPC ...... B32B 2260/046; B32B 2262/0269; B32B 2262/0276; C08L 61/34; C08L 63/00; C08J 5/24; C08J 2361/34; H01L 23/29
USPC .......................................... 523/400; 525/540
See application file for complete search history.

(56) References Cited

U.S. PATENT DOCUMENTS

| 2009/0130488 | A1  | 5/2009  | Sugano et al. |
| 2011/0205721 | A1* | 8/2011  | Endo .................. C08K 3/22 361/783 |
| 2013/0157061 | A1* | 6/2013  | Sogame ............. B32B 27/38 428/418 |
| 2013/0281640 | A1  | 10/2013 | Tsubuku et al. |
| 2014/0308530 | A1  | 10/2014 | Sugano et al. |
| 2015/0299110 | A1  | 10/2015 | Katagiri et al. |

FOREIGN PATENT DOCUMENTS

| JP | 2000-313737 | 11/2000 |
| JP | 2007-277102 | 10/2007 |
| JP | 4407823 | 2/2010 |
| JP | 2010-180147 | 8/2010 |
| JP | 4654770 | 3/2011 |
| JP | 2012-36114 | 2/2012 |
| JP | 5104312 | 12/2012 |
| JP | 2014-9336 | 1/2014 |
| JP | 2014-118428 | 6/2014 |
| JP | 2015-145487 | 8/2015 |
| JP | 6071120 | 2/2017 |
| KE | 6071120 | 2/2017 |
| WO | 2012/057144 | 5/2012 |
| WO | 2013/021869 | 2/2013 |
| WO | 2014-065422 | 5/2014 |

OTHER PUBLICATIONS

International Search Report issued in Patent Application No. PCT/JP2015/082954, dated Feb. 2, 2016.
International Preliminary Report on Patentability issued in PCT/JP2015/082954, dated Jun. 20, 2017.
Xuan Yi-ning et al., "Synthesis and properties of a novel epoxy resin containing binaphthalene unit," Modern Chemical Industry, 2004, pp. 178-183, vol. 24.
Decision to Grant from Japanese application JP 2016517001, dated Dec. 12, 2016 and English translation thereof.
Notification of Reasons for Refusal from Japanese application JP 2016517001, dated Aug. 16, 2016 and English translation thereof.
Written Argument dated Oct. 6 from Japanese application JP 2016517001, 2016 and English translation thereof.
Written Amendment dated Oct. 6 from Japanese application JP 2016517001, 2016 and English translation thereof.

* cited by examiner

| Retention time | Area% |
|---|---|
| 17.5分 | 18.3% |
| 17.8分 | 8.9% |
| 18.2分 | 12.7% |
| 18.9分 | 20.1% |
| 20.1分 | 36.1% |
| 21.3分 | 3.9% |

| Retention time | Area% |
|---|---|
| 17.3分 | 39.6% |
| 17.6分 | 5.1% |
| 18.0分 | 7.0% |
| 18.7分 | 12.7% |
| 19.9分 | 30.2% |
| 21.3分 | 4.0% |
| 21.8分 | 1.4% |

CYANIC ACID ESTER COMPOUND AND METHOD FOR PRODUCING SAME, RESIN COMPOSITION, AND CURED PRODUCT

TECHNICAL FIELD

The present invention relates to a cyanic acid ester compound and a method for producing the same, a resin composition comprising the cyanic acid ester compound, and a cured product of the resin composition.

BACKGROUND ART

Cyanic acid ester compounds form triazine rings by curing and are widely used as starting materials for various functional polymer materials such as composite materials for structures, adhesives, electrical insulating materials, and electric and electronic components, because of their high heat resistance and excellent electrical properties. In recent years, however, stricter physical properties have been demanded for functional polymer materials with a higher level of required performance in these fields of application. Examples of such physical properties include flame retardance, heat resistance, low rates of thermal expansion, low water absorbability, low permittivity, low dielectric loss tangent, weather resistance, chemical resistance, and high fracture toughness. However, these required physical properties have not always been satisfied so far.

For example, in the field of semiconductor packaging materials, undesired warpage occurs due to the mismatched coefficient of thermal expansion between semiconductor chips and substrate materials with thinning of substrates. As an approach for solving this problem, the functional polymer materials themselves for use in substrate materials are required to have lower thermal expansion and higher heat resistance. Furthermore, use of lead-free solder is promoted for the soldering of printed circuit boards, in consideration of human bodies and environments. In response to this, the functional polymer materials themselves are also required to have lower thermal expansion and higher heat resistance because of being capable of resisting a reflow step at a high temperature.

Conventional functional polymer materials may be allowed to contain a halogen atom or a phosphorus atom from the viewpoint of enhancing the flame retardance of the functional polymer materials. However, the halogen atom has the possibility of generating halogenated gases, which might cause environmental pollution, during combustion. In addition, the halogen atom reduces the insulating properties of final products. Also, the phosphorus atom often reduces the required physical properties (heat resistance, moisture resistance, and low water absorbability, etc.) except for flame retardance. Accordingly, there is also a demand for improving the flame retardance of the functional polymer materials without containing a halogen atom and a phosphorus atom.

In the case of producing a laminate for use in printed circuit boards, etc., first, monomers before curing are dissolved as functional polymer material precursors in a solvent such as methyl ethyl ketone to prepare varnish. Then, glass fiber is impregnated with this varnish and dried to prepare a prepreg. Therefore, there is also a demand for improving the solvent solubility of the monomers.

In the field of semiconductor encapsulation materials, studies have been actively conducted to replace silicon (Si) semiconductor devices with wide-gap semiconductors such as silicon carbide (SiC) semiconductors with the aim of reduction in power loss (energy saving). The SiC semiconductors are more chemically stable than the Si semiconductors and therefore permit operation at a high temperature exceeding 200° C. Thus, it can also be expected that apparatuses are miniaturized. In response to this, compositions comprising functional polymer materials for use in encapsulation materials are required to have heat resistance, low thermal expansion, and heat resistance at high temperatures over a long period (hereinafter, referred to as long-term heat resistance), etc.

Use of a bifunctional cyanatophenyl-type cyanic acid ester compound in which hydrogen of a methylene group that bonds cyanatophenyl groups is replaced with a particular alkyl group (1,1-bis(4-cyanatophenyl)isobutane) has been proposed as an example of obtaining a cured product of a cyanic acid ester compound alone which possesses low thermal expansion and heat resistance (see Patent Literature 1). However, for the bifunctional cyanatophenyl-type cyanic acid ester compound, the flame retardance (persistency at high temperatures) is reduced by replacing hydrogen of the methylene group that bonds cyanatophenyl groups with an alkyl group. Moreover, Patent Literature 1 has no mention about flame retardance and long-term heat resistance.

Use of a cyanic acid ester compound having an aralkyl structure has been proposed as an example of obtaining a cured product of a cyanic acid ester compound alone which possesses low thermal expansion and flame retardance (see Patent Literature 2). However, the cyanic acid ester compound having an aralkyl structure is poorly soluble in a solvent and is thus difficult to handle.

In addition, use of an isocyanuric acid skeleton-containing cyanic acid ester compound (see Patent Literature 3), a triazine skeleton-containing cyanic acid ester compound (see Patent Literature 4), a bifunctional cyanatophenyl-type cyanic acid ester compound in which hydrogen of a methylene group that bonds cyanatophenyl groups is replaced with a biphenyl group (see Patent Literature 5), and a cyanation product of a phenol-modified xylene formaldehyde resin (see Patent Literature 6), a combination of a trifunctional cyanatophenyl-type (trisphenolalkane-based) cyanic acid ester compound and a bifunctional cyanatophenyl-type cyanic acid ester compound (see Patent Literature 7), and a combination of a bisphenol A-based cyanic acid ester compound and an imide skeleton-containing cyanic acid ester compound (see Patent Literature 8) have been proposed as examples of obtaining a cured product of a cyanic acid ester compound alone which possesses flame retardance and/or heat resistance. However, all of these literatures have no mention about the rate of thermal expansion, long-term heat resistance, and/or solvent solubility.

CITATION LIST

Patent Literature

Patent Literature 1: International Publication No. WO 2012/057144
Patent Literature 2: Japanese Patent No. 4407823
Patent Literature 3: Japanese Patent No. 4654770
Patent Literature 4: Japanese Patent Laid-Open No. 2012-036114
Patent Literature 5: Japanese Patent No. 5104312
Patent Literature 6: International Publication No. WO 2013/21869
Patent Literature 7: Japanese Patent No. 2613056

Patent Literature 8: Japanese Patent Laid-Open No. 2010-180147

SUMMARY OF INVENTION

Technical Problem

As described above, a practical cured product of a cyanic acid ester compound that possesses low thermal expansion, flame retardance, and heat resistance at high levels has not yet been obtained by using a cyanic acid ester compound having solvent solubility.

The present invention has been made in light of the problems described above, and an object of the present invention is to provide a novel cyanic acid ester compound that has a low rate of thermal expansion, can provide a cured product having excellent flame retardance and heat resistance, and has excellent solvent solubility, and a method for producing the same, a resin composition comprising the cyanic acid ester compound, a cured product of the resin composition, and a prepreg, a metal foil-clad laminate, a resin sheet, a printed circuit board, a material for encapsulation, a fiber-reinforced composite material, and an adhesive comprising the resin composition.

Another object of the present invention is to provide a resin composition that has low water absorbability and can provide a cured product excellent in moisture-absorbing heat resistance and heat resistance, a cured product of the resin composition, and a prepreg, a metal foil-clad laminate, a resin sheet, a printed circuit board, a material for encapsulation, a fiber-reinforced composite material, and an adhesive comprising the resin composition.

Solution to Problem

The present inventors have conducted diligent studies to attain the objects. As a result, the present inventors completed the present invention by finding that the objects can be attained by a cyanic acid ester compound obtained by cyanation of a binaphthol aralkyl resin, and a resin composition comprising the cyanic acid ester compound.

Specifically, the present invention is as follows:

[1]
A cyanic acid ester compound (A) having a structure represented by the following general formula (1):

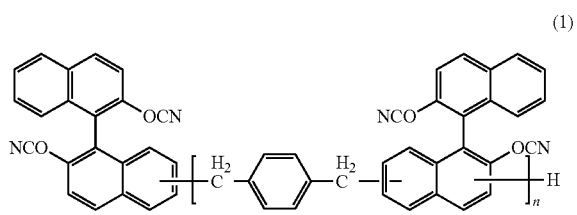

(1)

wherein n represents an integer of 1 or larger.

[2]
The cyanic acid ester compound (A) according to the above [1], wherein the cyanic acid ester compound has a weight-average molecular weight Mw of 100 to 5000.

[3]
A method for producing a cyanic acid ester compound, comprising a cyanation step of cyanating a binaphthol aralkyl resin to obtain a cyanic acid ester compound (A) having a structure represented by the following general formula (1):

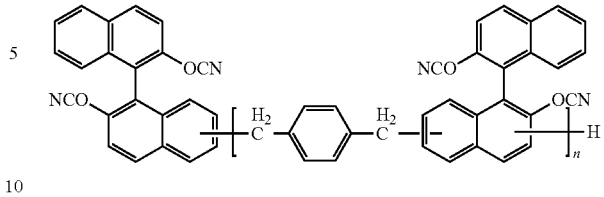

(1)

wherein n represents an integer of 1 or larger.

[4]
The method for producing the cyanic acid ester compound according to the above [3], further comprising, before the cyanation step, the step of reacting paraxylene glycol and/or 1,4-bis(methoxymethyl)benzene with 1,1'-bi-2-naphthol in the presence of an acidic catalyst to obtain the binaphthol aralkyl resin.

[5]
A resin composition comprising the cyanic acid ester compound (A) according to the above [1] or [2].

[6]
The resin composition according to the above [5], further comprising one or more components selected from the group consisting of a cyanic acid ester compound (B) other than the cyanic acid ester compound, a maleimide compound (C), a phenol resin (D), an epoxy resin (E), an oxetane resin (F), a benzoxazine compound (G), and a compound (H) having a polymerizable unsaturated group.

[7]
The resin composition according to the above [5] or [6], wherein a content of the cyanic acid ester compound (A) is 1 to 90 parts by mass with respect to 100 parts by mass of resin solids in the resin composition.

[8]
The resin composition according to any one of the above [5] to [7], further comprising a filler (I).

[9]
The resin composition according to any one of the above [6] to [8], wherein the epoxy resin (E) comprises one or more resins selected from the group consisting of a biphenyl aralkyl-based epoxy resin, a naphthylene ether-based epoxy resin, a polyfunctional phenol-based epoxy resin, and a naphthalene-based epoxy resin.

[10]
The resin composition according to the above [8] or [9], wherein a content of the filler (I) is 50 to 1600 parts by mass with respect to 100 parts by mass of resin solids in the resin composition.

[11]
A cured product obtained by curing the resin composition according to any one of the above [5] to [10].

[12]
A prepreg comprising
a base material, and
the resin composition according to any one of the above [5] to [10] with which the base material is impregnated or coated.

[13]
A metal foil-clad laminate comprising
at least one or more layers of the prepreg according to the above [12], and
a metal foil disposed on one side or both sides of the prepreg.

[14]
A resin sheet comprising
a support, and
a layer comprising the resin composition according to any one of the above [5] to [10] disposed on a surface of the support.
[15]
A printed circuit board comprising
an insulating layer comprising the resin composition according to any one of the above [5] to [10], and
a conductor layer disposed on a surface of the insulating layer.
[16]
A material for encapsulation comprising the resin composition according to any one of the above [5] to [10].
[17]
A fiber-reinforced composite material comprising the resin composition according to any one of the above [5] to [10].
[18]
An adhesive comprising the resin composition according to any one of the above [5] to [10].

Advantageous Effects of Invention

The present invention can provide a novel cyanic acid ester compound that has a low rate of thermal expansion, can provide a cured product having excellent flame retardance and heat resistance, and has excellent solvent solubility, and a method for producing the same, a resin composition comprising the cyanic acid ester compound, a cured product of the resin composition, and a prepreg, a metal foil-clad laminate, a resin sheet, a printed circuit board, a material for encapsulation, a fiber-reinforced composite material, and an adhesive comprising the resin composition.

The present invention can also provide a resin composition that has low water absorbability and can provide a cured product excellent in moisture-absorbing heat resistance and heat resistance, a cured product of the resin composition, and a prepreg, a metal foil-clad laminate, a resin sheet, a printed circuit board, a material for encapsulation, a fiber-reinforced composite material, and an adhesive comprising the resin composition.

DESCRIPTION OF EMBODIMENTS

Figure 1:
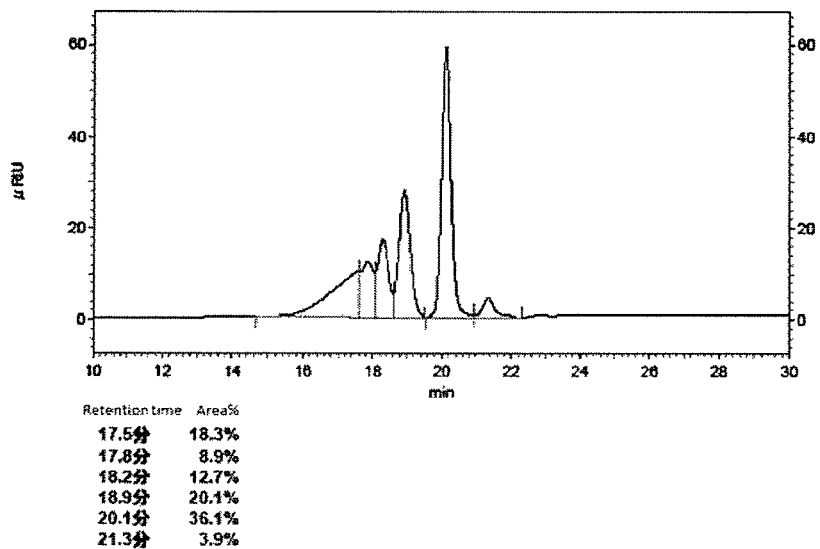
FIG. 1 shows a GPC chart of a binaphthol aralkyl resin.

Hereinafter, the mode for carrying out the present invention (hereinafter, referred to as the "present embodiment") will be described in detail. However, the present invention is not intended to be limited by the present embodiment, and various changes or modifications can be made therein without departing from the spirit of the present invention.
[Cyanic Acid Ester Compound]
The cyanic acid ester compound of the present embodiment (hereinafter, also referred to as a "cyanic acid ester compound (A)") has a structure represented by the following general formula (1):

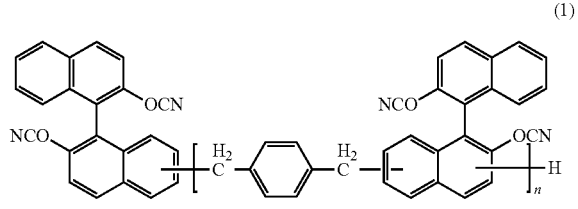

wherein n represents an integer of 1 or larger.

The weight-average molecular weight Mw of the cyanic acid ester compound (A) is preferably 100 to 5000, more preferably 200 to 4500, further preferably 250 to 4000. When the weight-average molecular weight Mw of the cyanic acid ester compound (A) falls within the range described above, the heat resistance tends to be further improved. The weight-average molecular weight Mw can be measured by GPC.

n is an integer of 1 or larger and is preferably 1 to 50, more preferably 1 to 25, further preferably 1 to 15, still further preferably 2 to 10.
[Method for Producing Cyanic Acid Ester Compound (A)]
The method for producing the cyanic acid ester compound (A) of the present embodiment may comprise, for example, a cyanation step of cyanating a binaphthol aralkyl resin to obtain the cyanic acid ester compound (A) having a structure represented by the general formula (1) and, if necessary, may further comprise, before the cyanation step, a binaphthol aralkyl resin synthesis step of reacting paraxylene glycol and/or 1,4-bis(methoxymethyl)benzene with 1,1'-bi-2-naphthol in the presence of an acidic catalyst to obtain the binaphthol aralkyl resin. Hereinafter, each step will be described in detail.

(Binaphthol Aralkyl Resin Synthesis Step)
The binaphthol aralkyl resin synthesis step is the step of reacting paraxylene glycol or 1,4-bis(methoxymethyl)benzene with 1,1'-bi-2-naphthol in the presence of an acidic catalyst to obtain the binaphthol aralkyl resin. This reaction can be performed by a method described in, for example, Japanese Patent Laid-Open No. 2014-9336.

Examples of the binaphthol aralkyl resin include, but are not particularly limited to, a compound represented by the general formula (2) given below. The obtained binaphthol aralkyl resin may be a mixture of compounds differing in n.

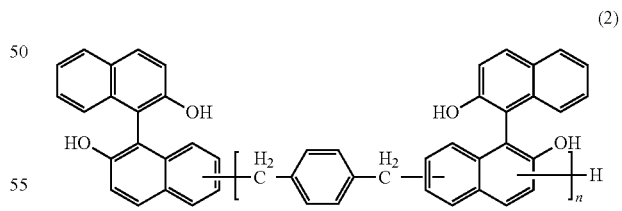

wherein n represents an integer of 1 or larger.

Examples of the acidic catalyst for use in the production of the binaphthol aralkyl resin include, but are not particularly limited to, acidic catalysts usually used for novolac resin production. Specific examples thereof include: mineral acids such as hydrochloric acid, sulfuric acid, and phosphoric acid; organic acids such as oxalic acid, toluenesulfonic acid, and acetic acid; heteropoly acids such as tungstic acid; activated clay; inorganic acids; and other organic and inorganic acid salts that exhibit acidity, such as stannic chloride, zinc chloride, and ferric chloride. One type of acidic catalyst or two or more types of acidic catalysts in combination can be used.

The amount of the acidic catalyst used is usually 0.005 to 2.0 mol, preferably 0.01 to 1.1 mol, with respect to 1 mol of the 1,1'-bi-2-naphthol. When the amount of the acidic catalyst is 0.005 mol or larger, the progression of the reaction is accelerated so that the reaction tends to be able to proceed at a lower temperature. When the amount of the acidic catalyst is 2.0 mol or smaller, treatment cost for subsequent aftertreatment such as neutralization or purification tends to be able to be further reduced.

If necessary, an inert solvent can also be used in the reaction. Examples of the solvent include, but are not particularly limited to: alcohol solvents such as methanol, ethanol, propanol, and isopropanol; aromatic hydrocarbon solvents such as toluene and xylene; and ketone solvents such as methyl isobutyl ketone, acetone, cyclopentanone, and methyl ethyl ketone. One type of solvent or two or more types of solvents in combination can be used. In the case of using the solvent, the amount of the solvent used is usually 5 to 500 parts by mass, preferably 10 to 400 parts by mass, with respect to 100 parts by mass of the 1,1'-bi-2-naphthol.

The reaction temperature in the reaction is usually 0 to 200° C., preferably 40 to 150° C. The reaction time in the reaction is usually 1 to 200 hours, preferably 5 to 150 hours. Under such reaction conditions, the progression of the reaction tends to be further accelerated.

In the reaction, in the case of using paraxylene glycol, the amount of the 1,1'-bi-2-naphthol used is usually 1.2 to 20 mol, preferably 1.5 to 10 mol, with respect to 1 mol of the paraxylene glycol. When the amount of the 1,1'-bi-2-naphthol used is 1.2 mol or larger with respect to 1 mol of the paraxylene glycol, the resulting binaphthol aralkyl resin tends to have a lower softening point. When the amount of the 1,1'-bi-2-naphthol used is 20 mol or smaller with respect to 1 mol of the paraxylene glycol, the compound represented by the general formula (2) is produced in a larger amount and the heat resistance of the finally obtained cyanic acid ester compound (A) tends to be further improved.

In the reaction, in the case of using 1,4-bis(methoxymethyl)benzene, the amount of the 1,1'-bi-2-naphthol used is usually 1.2 to 20 mol, preferably 1.5 to 10 mol, with respect to 1 mol of the 1,4-bis(methoxymethyl)benzene. When the amount of the 1,1'-bi-2-naphthol used is 1.2 mol or larger with respect to 1 mol of the 1,4-bis(methoxymethyl)benzene, the resulting binaphthol aralkyl resin tends to have a lower softening point. When the amount of the 1,1'-bi-2-naphthol used is 20 mol or smaller with respect to 1 mol of the 1,4-bis(methoxymethyl)benzene, the compound represented by the general formula (2) is produced in a larger amount and the heat resistance of the finally obtained cyanic acid ester compound (A) tends to be further improved.

Examples of specific methods for the reaction include, but are not particularly limited to: a method which involves adding an acidic catalyst into a mixture of paraxylene glycol and/or 1,4-bis(methoxymethyl)benzene and 1,1'-bi-2-naphthol (and a solvent, if necessary), followed by heating; a method which involves gradually adding paraxylene glycol and/or 1,4-bis(methoxymethyl)benzene to a mixture of 1,1'-bi-2-naphthol and an acidic catalyst (and a solvent, if necessary) under heating. The reaction may be performed with stirring, may be performed in air or an inert atmosphere (nitrogen, helium, argon, etc.), and may be performed under normal pressure or increased pressure. The progression of the reaction can be confirmed (or monitored) by high-performance liquid chromatography (HPLC), thing-layer chromatography (TLC), or the like.

After the completion of the reaction, the reaction mixture contains unreacted paraxylene glycol and/or 1,4-bis (methoxymethyl)benzene, unreacted 1,1'-bi-2-naphthol, the acidic catalyst, reaction by-products, etc. Therefore, the binaphthol aralkyl resin may be isolated by separation and purification using a method routinely used, for example, a separation approach such as neutralization, washing with water, filtration, concentration, extraction, crystallization, recrystallization, or column chromatography, or a combination of these separation approaches.

(Cyanation Step)

The cyanation step is the step of cyanating a binaphthol aralkyl resin to obtain the cyanic acid ester compound (A) having a structure represented by the general formula (1). Specifically, this step involves cyanating the hydroxy groups of a binaphthol aralkyl resin represented by the general formula (2) given below to obtain the cyanic acid ester compound (A) having a structure represented by the general formula (1). The binaphthol aralkyl resin for use in the cyanation step may be a mixture of compounds differing in n.

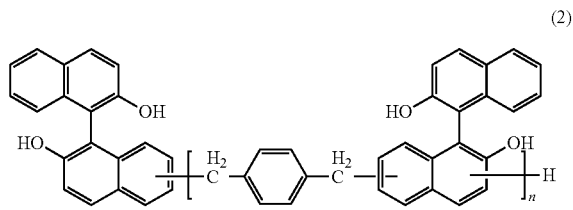

(2)

wherein n represents an integer of 1 or larger.

The cyanation method is not particularly limited, and a method known in the art can be applied thereto. Specific examples thereof include: a method which involves reacting the binaphthol aralkyl resin with a cyanogen halide in the presence of a basic compound in a solvent; a method which involves reacting the binaphthol aralkyl resin with a cyanogen halide in the presence of a base in a solvent such that the cyanogen halide is always present in excess of the base (U.S. Pat. No. 3,553,244); a method which involves using a tertiary amine as a base, and using this tertiary amine in excess of a cyanogen halide while adding the tertiary amine to the binaphthol aralkyl resin in the presence of a solvent and then adding the cyanogen halide dropwise, or adding dropwise the cyanogen halide and the tertiary amine in combination (Japanese Patent No. 3319061); a method which involves reacting the binaphthol aralkyl resin, a trialkylamine, and a cyanogen halide in a continuous plug flow manner (Japanese Patent No. 3905559); a method which involves reacting the binaphthol aralkyl resin with a cyanogen halide in the presence of a tert-amine in a non-aqueous solution and treating the resulting by-product tert-ammonium halide with cation and anion exchange pairs (Japanese Patent No. 4055210); a method which involves simultaneously adding a tertiary amine and a cyanogen halide to the binaphthol aralkyl resin in the presence of a solvent separable from water, reacting the mixture, then washing the reaction mixture with water, separating the reaction mixture into aqueous and organic layers, and purifying the reaction product from the obtained solution by precipitation using a secondary or tertiary alcohol or a hydrocarbon as a poor solvent (Japanese Patent No.

2991054); a method which involves reacting the binaphthol aralkyl resin, a cyanogen halide, and a tertiary amine under acidic conditions in a two-phase solvent of water and an organic solvent (Japanese Patent No. 5026727); and a method which involves cyanating the hydroxy groups of the binaphthol aralkyl resin according to a method described in Ian Hamerton, "Chemistry and Technology of Cyanate Ester Resins", Blackie Academic & Professional.

Hereinafter, the method which involves reacting the binaphthol aralkyl resin with a cyanogen halide in the presence of a basic compound in a solvent will be described as an example. In this case, the binaphthol aralkyl resin serving as a reaction substrate is dissolved in advance in either of a cyanogen halide solution or a basic compound solution, and the cyanogen halide solution and the basic compound solution are then contacted with each other.

Examples of the method for contacting the cyanogen halide solution and the basic compound solution with each other (contact method) include: a method (A) of pouring the basic compound solution to the cyanogen halide solution mixed by stirring; a method (B) of pouring the cyanogen halide solution to the basic compound solution mixed by stirring; and a method (C) of supplying the cyanogen halide solution and the basic compound solution either alternately in a continuous manner or at the same time. Among the method (A), the method (B), and the method (C), the method (A) is preferred from the viewpoint of suppressing side reaction and obtaining a more highly pure cyanic acid ester compound at a high yield.

The contact method of the cyanogen halide solution and the basic compound solution may be performed in a semi-batch format or a continuous circulation format. Particularly, in the case of using the method (A), it is preferred to pour the basic compound in divided portions, because the reaction can be completed without allowing the hydroxy groups of the binaphthol aralkyl resin to remain and a more highly pure cyanic acid ester compound can be obtained at a high yield. The number of divisions is not particularly limited and is preferably 1 to 5. The type of the basic compound may be the same or different for each division.

Examples of the cyanogen halide used in the present embodiment include, but are not particularly limited to, cyanogen chloride and cyanogen bromide. The cyanogen halide used may be a cyanogen halide obtained by a production method known in the art such as a method of reacting hydrogen cyanide or metal cyanide with halogen, or may be a commercially available product. Alternatively, a reaction solution containing the cyanogen halide obtained by reacting hydrogen cyanide or metal cyanide with halogen may be used directly.

In the cyanation step of the present embodiment, the amount of the cyanogen halide used is usually 0.5 to 5 mol, preferably 1.0 to 3.5 mol, with respect to 1 mol of the hydroxy groups of the binaphthol aralkyl resin. When the amount of the cyanogen halide used falls within the range described above, an unreacted binaphthol aralkyl resin can be decreased so that the yield of the cyanic acid ester compound tends to be further improved.

Examples of the solvent for use in the cyanogen halide solution include, but are not particularly limited to: ketone solvents such as acetone, methyl ethyl ketone, methyl isobutyl ketone, cyclohexanone, and cyclopentanone; aliphatic hydrocarbon solvents such as n-hexane, cyclohexane, and isooctane; aromatic hydrocarbon solvents such as benzene, toluene, and xylene; ether solvents such as diethyl ether, dimethyl cellosolve, diglyme, tetrahydrofuran, methyltetrahydrofuran, dioxane, and tetraethylene glycol dimethyl ether; halogenated hydrocarbon solvents such as dichloromethane, chloroform, carbon tetrachloride, dichloroethane, trichloroethane, chlorobenzene, and bromobenzene; alcohol solvents such as methanol, ethanol, isopropanol, methyl cellosolve, and propylene glycol monomethyl ether; aprotic polar solvents such as N,N-dimethylformamide, N-methylpyrrolidone, 1,3-dimethyl-2-imidazolidone, and dimethyl sulfoxide; nitrile solvents such as acetonitrile and benzonitrile; nitro solvents such as nitromethane and nitrobenzene; ester solvents such as ethyl acetate and ethyl benzoate; and a water solvent. According to the reaction substrate, one type of solvent can be used alone, or two or more types of solvents can be used in combination.

Any of organic and inorganic bases can be used as the basic compound for use in the cyanation step of the present embodiment. One of these basic compounds is used alone, or two or more thereof are used in combination.

Examples of the organic base include, but are not particularly limited to, tertiary amines such as trimethylamine, triethylamine, tri-n-butylamine, triamylamine, diisopropylethylamine, diethyl-n-butylamine, methyl-di-n-butylamine, methylethyl-n-butylamine, dodecyldimethylamine, tribenzylamine, triethanolamine, N,N-dimethylaniline, N,N-diethylaniline, diphenylmethylamine, pyridine, diethylcyclohexylamine, tricyclohexylamine, 1,4-diazabicyclo[2.2.2]octane, 1,8-diazabicyclo[5.4.0]-7-undecene, and 1,5-diazabicyclo[4.3.0]-5-nonene. Among these organic bases, trimethylamine, triethylamine, tri-n-butylamine, and diisopropylethylamine are preferred, and triethylamine is more preferred, from the viewpoint of, for example, obtaining the compound of interest at a good yield.

The amount of the organic base used is preferably 0.1 to 8 mol, more preferably 1.0 to 3.5 mol, with respect to 1 mol of the hydroxy groups of the binaphthol aralkyl resin. When the amount of the organic base used falls within the range described above, an unreacted binaphthol aralkyl resin can be decreased so that the yield of the cyanic acid ester compound tends to be further improved.

Examples of the inorganic base include, but are not particularly limited to, hydroxides of alkali metals. Examples of the hydroxides of alkali metals include, but are not particularly limited to, sodium hydroxide, potassium hydroxide, and lithium hydroxide generally used industrially. Among these inorganic bases, sodium hydroxide is particularly preferred because of being inexpensively available.

The amount of the inorganic base used is preferably 1.0 to 5.0 mol, more preferably 1.0 to 3.5 mol, with respect to 1 mol of the hydroxy groups of the binaphthol aralkyl resin. When the amount of the inorganic base used falls within the range described above, an unreacted binaphthol aralkyl resin can be decreased so that the yield of the cyanic acid ester compound tends to be further improved.

In the reaction of the cyanation step, the basic compound can be dissolved in a solvent and used as a solution, as mentioned above. An organic solvent or water can be used as the solvent.

In the case of dissolving the binaphthol aralkyl resin in the basic compound solution, the amount of the solvent used in the basic compound solution is preferably 0.1 to 100 parts by mass, more preferably 0.5 to 50 parts by mass, with respect to 1 part by mass of the binaphthol aralkyl resin. In the case of not dissolving the binaphthol aralkyl resin in the basic compound solution, the amount of the solvent used in the basic compound solution is preferably 0.1 to 100 parts by mass, more preferably 0.25 to 50 parts by mass, with respect to 1 part by mass of the basic compound.

The organic solvent for dissolving the basic compound is preferably used when the basic compound is an organic base. Examples thereof include: ketone solvents such as acetone, methyl ethyl ketone, and methyl isobutyl ketone; aromatic hydrocarbon solvents such as benzene, toluene, and xylene; ether solvents such as diethyl ether, dimethyl cellosolve, diglyme, tetrahydrofuran, methyltetrahydrofuran, dioxane, and tetraethylene glycol dimethyl ether; halogenated hydrocarbon solvents such as dichloromethane, chloroform, carbon tetrachloride, dichloroethane, trichloroethane, chlorobenzene, and bromobenzene; alcohol solvents such as methanol, ethanol, isopropanol, methyl cellosolve, and propylene glycol monomethyl ether; aprotic polar solvents such as N,N-dimethylformamide, N-methylpyrrolidone, 1,3-dimethyl-2-imidazolidone, and dimethyl sulfoxide; nitrile solvents such as acetonitrile and benzonitrile; nitro solvents such as nitromethane and nitrobenzene; ester solvents such as ethyl acetate and ethyl benzoate; and aliphatic hydrocarbon solvents such as cyclohexane. The organic solvent can be appropriately selected according to the basic compound, the reaction substrate, and the solvent for use in the reaction. One type of organic solvent can be used alone, or two or more types of organic solvents can be used in combination.

The water for dissolving the basic compound is preferably used when the basic compound is an inorganic base. The water is not particularly limited and may be tap water, may be distilled water, or may be deionized water. Distilled water and deionized water containing few impurities are preferred from the viewpoint of efficiently obtaining the cyanic acid ester compound of interest.

When the solvent for use in the basic compound solution is water, it is preferred to use a catalytic amount of an organic base as a surfactant, from the viewpoint of securing a more sufficient reaction rate. Among others, a tertiary amine less likely to cause side reaction is preferred. The tertiary amine may be any alkylamine, arylamine, or cycloalkylamine. Specific examples thereof include trimethylamine, triethylamine, tri-n-butylamine, triamylamine, diisopropylethylamine, diethyl-n-butylamine, methyl-di-n-butylamine, methylethyl-n-butylamine, dodecyldimethylamine, tribenzylamine, triethanolamine, N,N-dimethylaniline, N,N-diethylaniline, diphenylmethylamine, pyridine, diethylcyclohexylamine, tricyclohexylamine, 1,4-diazabicyclo[2.2.2]octane, 1,8-diazabicyclo[5.4.0]-7-undecene, and 1,5-diazabicyclo[4.3.0]-5-nonene. Among these tertiary amines, trimethylamine, triethylamine, tri-n-butylamine, and diisopropylethylamine are more preferred, and triethylamine is particularly preferred, from the viewpoint of solubility in water and from the viewpoint of obtaining the compound of interest at a better yield. One of these tertiary amines is used alone, or two or more thereof are used in combination.

The total amount of the solvents for use in the cyanation step of the present embodiment is preferably 2.5 to 100 parts by mass with respect to 1 part by mass of the binaphthol aralkyl resin from the viewpoint of more uniformly dissolving the binaphthol aralkyl resin and more efficiently producing the cyanic acid ester compound.

In the cyanation step of the present embodiment, the pH of the reaction solution is not particularly limited, and the reaction is preferably performed with the pH kept at lower than 7. When the pH is kept at lower than 7, the formation of by-products such as imidocarbonate and polymerization products of the cyanic acid ester compound is suppressed so that the cyanic acid ester compound tends to be able to be efficiently produced. A method of adding an acid to the reaction solution is preferred for keeping the pH of the reaction solution at lower than 7. It is more preferred to keep the pH at lower than 7 by adding an acid to the cyanogen halide solution immediately before the cyanation step and by adding an acid to the reaction system while appropriately measuring the pH of the reaction solution using a pH meter during the reaction.

Examples of the acid for use in this operation include: inorganic acids such as hydrochloric acid, nitric acid, sulfuric acid, and phosphoric acid; and organic acids such as acetic acid, lactic acid, and propionic acid.

The reaction temperature in the cyanation step of the present embodiment is preferably −20 to +50° C., more preferably −15 to 15° C., further preferably −10 to 10° C., from the viewpoint of suppressing the formation of by-products such as imidocarbonate, polymerization products of the cyanic acid ester compound, and dialkyl cyanamide, the condensation of the reaction solution, and, in the case of using cyanogen chloride as the cyanogen halide, the volatilization of the cyanogen chloride.

The reaction pressure in the cyanation step of the present embodiment may be normal pressure or increased pressure. In necessary, an inert gas such as nitrogen, helium, or argon may be blown into the reaction system.

The reaction time is not particularly limited, and the pouring time for the method (A) and the method (B) and the contact time for the method (C) is preferably 1 minute to 20 hours, more preferably 3 minutes to 10 hours. It is further preferred to then stir the reaction solution for 10 minutes to 10 hours with the reaction temperature maintained. When the reaction conditions fall within the range as described above, the cyanic acid ester compound of interest tends to be obtained more economically and more industrially.

In the cyanation step, the degree of progression of the reaction can be analyzed by liquid chromatography or IR spectroscopy, etc. Volatile components such as by-products dicyanogen and dialkyl cyanamide can be analyzed by gas chromatography.

After the completion of the reaction, the cyanic acid ester compound of interest can be isolated by usual aftertreatment operation and, if desired, separation and purification operation. Specifically, an organic solvent phase containing the cyanic acid ester compound can be separated from the reaction solution and washed with water, followed by concentration, precipitation, or crystallization or washed with water, followed by solvent substitution. For the washing, a method using an acidic aqueous solution such as dilute hydrochloric acid can also be adopted in order to remove an excess of amines. The thoroughly washed reaction solution can be dried by a general method using sodium sulfate, magnesium sulfate, or the like in order to remove water therefrom. For the concentration and the solvent substitution, the organic solvent is distilled off by heating to a temperature of 90° C. or lower under reduced pressure in order to suppress the polymerization of the cyanic acid ester compound. For the precipitation or the crystallization, a solvent having a low degree of dissolution can be used. For example, a method of adding dropwise an ether solvent, a hydrocarbon solvent (e.g., hexane), or an alcohol solvent to the reaction solution or pouring the reaction solution to the solvent can be adopted. A method of washing the concentrate of the reaction solution or precipitated crystals with an ether solvent, a hydrocarbon solvent (e.g., hexane), or an alcohol solvent can be adopted in order to wash the obtained crude product. Crystals obtained by the concentration of the reaction solution may be redissolved and then recrystallized.

The crystallization may be performed by the simple concentration or cooling of the reaction solution.

The obtained cyanic acid ester compound can be identified by a method known in the art such as NMR. The purity of the cyanic acid ester compound can be analyzed by liquid chromatography or IR spectroscopy, etc. Volatile components such as by-products (e.g., dialkyl cyanamide) or residual solvents in the cyanic acid ester compound can be quantitatively analyzed by gas chromatography. Halogen compounds remaining in the cyanic acid ester compound can be identified using a liquid chromatography-mass spectrometer and can also be quantitatively analyzed by potentiometric titration using a silver nitrate solution or by ion chromatography after decomposition by a combustion method. The polymerization reactivity of the cyanic acid ester compound can be evaluated on the basis of the time to gel by a hot plate method or a torque measurement method.

[Resin Composition]

The resin composition of the present embodiment comprises the cyanic acid ester compound (A) and may optionally comprise, for example, a cyanic acid ester compound (B) other than the cyanic acid ester compound (A), a maleimide compound (C), a phenol resin (D), an epoxy resin (E), an oxetane resin (F), a benzoxazine compound (G), and/or a compound (H) having a polymerizable unsaturated group. The resin composition of the present embodiment may optionally further comprise a polymerization catalyst, a filler (I), a solvent, and other components. Hereinafter, each component will be described.

(Cyanic Acid Ester Compound (A))

Use of the cyanic acid ester compound (A) can produce a resin composition that provides a cured product having low water absorbability and excellent moisture-absorbing heat resistance and heat resistance.

The content of the cyanic acid ester compound (A) is preferably 1 to 90 parts by mass, more preferably 10 to 80 parts by mass, further preferably 20 to 70 parts by mass, still further preferably 25 to 65 parts by mass, with respect to 100 parts by mass of resin solids in the resin composition. When the content of the cyanic acid ester compound (A) falls within the range described above, the resulting cured product tends to have lower water absorbability and better moisture-absorbing heat resistance and heat resistance. In this context, the "resin solids in the resin composition" refer to the components except for the solvent and the filler mentioned later, unless otherwise specified. 100 parts by mass of resin solids refer to 100 parts by mass in total of the components except for the solvent and the filler in the resin composition.

(Cyanic Acid Ester Compound (B))

The cyanic acid ester compound (B) is not particularly limited as long as the cyanic acid ester compound (B) is a compound other than the cyanic acid ester compound (A). A compound intramolecularly having an aromatic group in which at least one hydrogen atom is replaced with a cyanato group is preferred. Examples of such a cyanic acid ester compound (B) include, but are not particularly limited to, a cyanato group-substituted aromatic compound represented by the following general formula (3):

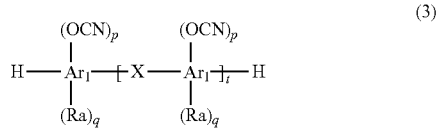

(3)

wherein each $Ar_1$ independently represents a phenylene group optionally having a substituent, a naphthylene group optionally having a substituent, or a biphenylene group optionally having a substituent; each Ra independently represents a hydrogen atom, an alkyl group having 1 to 6 carbon atoms and optionally having a substituent, an aryl group having 6 to 12 carbon atoms and optionally having a substituent, an alkoxy group having 1 to 4 carbon atoms and optionally having a substituent, an aralkyl group optionally having a substituent in which an alkyl group having 1 to 6 carbon atoms is bonded to an aryl group having 6 to 12 carbon atoms, or an alkylaryl group optionally having a substituent in which an alkyl group having 1 to 6 carbon atoms is bonded to an aryl group having 6 to 12 carbon atoms; the positions of the substituents for $Ar_1$ and Ra can be arbitrarily selected; p represents the number of a cyanato group bonded to $Ar_1$ and each p is independently an integer of 1 to 3; q represents the number of Ra bonded to $Ar_1$ and is 4-p when $Ar_1$ is a phenylene group, 6-p when $Ar_1$ is a naphthylene group, and 8-p when $Ar_1$ is a biphenylene group; t represents the average number of a repeat and is an integer of 0 to 50 (the compound may be a mixture of compounds differing in t); each X independently represents a single bond, a divalent organic group having 1 to 50 carbon atoms (a hydrogen atom may be replaced with a heteroatom), a divalent organic group having 1 to 10 nitrogen atoms (e.g., —N—R—N— (wherein R represents an organic group)), a carbonyl group (—CO—), a carboxy group (—C(=O)O—), a carbonyl dioxide group (—OC(=O)O—), a sulfonyl group (—$SO_2$—), a divalent sulfur atom, or a divalent oxygen atom.

Any hydrogen atom in the phenylene group, the naphthylene group, or the biphenylene group represented by $Ar_1$ in the general formula (3) may be replaced with a halogen atom such as a fluorine atom or a chlorine atom, an alkoxy group such as a methoxy group or a phenoxy group, a cyanato group, or the like.

The alkyl group having 1 to 6 carbon atoms represented by Ra in the general formula (3) may have any of linear, branched, and cyclic structures (e.g., a cycloalkyl group). Examples of such an alkyl group include, but are not particularly limited to, a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, and a cyclohexyl group. Any hydrogen atom in the alkyl group in the general formula (3) may be replaced with a halogen atom such as a fluorine atom or a chlorine atom, an alkoxy group such as a methoxy group or a phenoxy group, a cyanato group, or the like. Examples of the alkyl group having 1 to 6 carbon atoms and having a substituent include, but are not particularly limited to, a trifluoromethyl group.

Examples of the aryl group having 6 to 12 carbon atoms represented by Ra in the general formula (3) include, but are not limited to, a phenyl group, a xylyl group, a mesityl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Examples of the alkoxy group include a methoxy group, an ethoxy group, a propoxy group, an isopropoxy group, a n-butoxy group, an isobutoxy group, and a tert-butoxy group. Any hydrogen atom in the aryl group in the general formula (3) may be replaced with a halogen atom such as fluorine or chlorine, an alkoxy group such as a methoxy group or a phenoxy group, a cyanato group, a hydroxy group, or the like. Examples of the aryl group having 6 to 12 carbon atoms and having a substituent include, but are not particularly limited to, an aryl group having at least one phenolic hydroxy group.

The alkoxy group having 1 to 4 carbon atoms represented by Ra in the general formula (3) may have a linear structure, a branched structure, or a cyclic structure. Examples of such an alkoxy group include, but are not particularly limited to, a methoxy group, an ethoxy group, a propoxy group, an isopropoxy group, a n-butoxy group, an isobutoxy group, and a tert-butoxy group. Any hydrogen atom in the alkoxy group in the general formula (3) may be replaced with a halogen atom such as fluorine or chlorine, an alkoxy group such as a methoxy group or a phenoxy group, a cyanato group, or the like.

Examples of the divalent organic group having 1 to 50 carbon atoms represented by X in the general formula (3) include, but are not particularly limited to: alkylene groups such as a methylene group, an ethylene group, a trimethylene group, and a propylene group; cycloalkylene groups such as a cyclopentylene group, a cyclohexylene group, and a trimethylcyclohexylene group; and divalent organic groups having an aromatic ring, such as a biphenylylmethylene group, a dimethylmethylene-phenylene-dimethylmethylene group, a fluorenediyl group, and a phthalidodiyl group. A hydrogen atom in the divalent organic group may be replaced with a heteroatom. Examples of the heteroatom include, but are not particularly limited to, halogen atoms such as a fluorine atom and a chlorine atom. Also, a hydrogen atom in the divalent organic group having 1 to 50 carbon atoms may be replaced with an alkoxy group such as a methoxy group or a phenoxy group, a cyanato group, or the like.

Examples of the divalent organic group having 1 to 10 nitrogen atoms represented by X in the general formula (3) include, but are not particularly limited to, a group represented by —N—R—N—, an imino group, and a polyimide group.

X in the general formula (3) is preferably a divalent linking group selected from the group consisting of a divalent organic group represented by the following general formula (4), a divalent organic group represented by the following general formula (5), and divalent groups represented by the following general formulas (6a), (6b), (6c), (6d), (6e), (6f), (6g), (6h), (6i), and (6j):

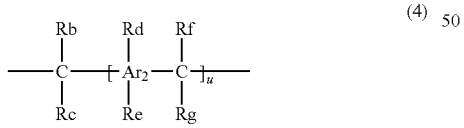
(4)

wherein each $Ar_2$ independently represents a phenylene group optionally having a substituent, a naphthylene group optionally having a substituent, or a biphenylene group optionally having a substituent; Rb, Rc, Rf, and Rg each independently represent a hydrogen atom, an alkyl group having 1 to 6 carbon atoms and optionally having a substituent, or an aryl group having 6 to 12 carbon atoms and optionally having a substituent; Rd and Re each independently represent a hydrogen atom, an alkyl group having 1 to 6 carbon atoms and optionally having a substituent, an aryl group having 6 to 12 carbon atoms and optionally having a substituent, an alkoxy group having 1 to 4 carbon atoms and optionally having a substituent, or a hydroxy group; and u represents an integer of 0 to 5.

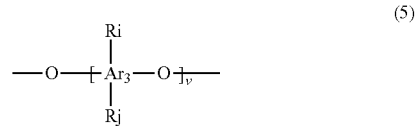
(5)

wherein each $Ar_3$ independently represents a phenylene group optionally having a substituent, a naphthylene group optionally having a substituent, or a biphenylene group optionally having a substituent; Ri and Rj each independently represent a hydrogen atom, an alkyl group having 1 to 6 carbon atoms and optionally having a substituent, an aryl group having 6 to 12 carbon atoms and optionally having a substituent, a benzyl group, an alkoxy group having 1 to 4 carbon atoms and optionally having a substituent, a hydroxy group, a trifluoromethyl group, or an aryl group substituted by at least one cyanato group; and v represents an integer of 0 to 5 (the compound may be a mixture of compounds differing in v).

(6a)

(6b)

(6c)

(6d)

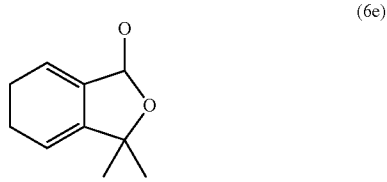
(6e)

(6f)

(6g)

(6h)

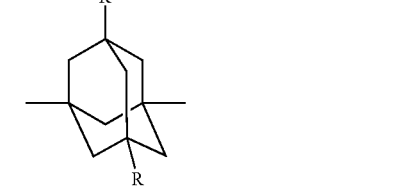
(6i)

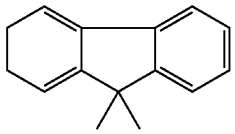

(6j)

wherein m represents an integer of 4 to 7; and each R independently represents a hydrogen atom or an alkyl group having 1 to 6 carbon atoms and optionally having a substituent.

Examples of $Ar_2$ in the general formula (4) and $Ar_3$ in the general formula (5) include, but are not particularly limited to, a 1,4-phenylene group, a 1,3-phenylene group, a 4,4'-biphenylene group, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, a 1,4-naphthylene group, and a 2,7-naphthylene group.

Examples of the alkyl group and the aryl group represented by Rb, Rc, Rf, and Rg in the general formula (4) and Ri and Rj in the general formula (5) can include the same as in the general formula (3).

Specific examples of the cyanato-substituted aromatic compound represented by the general formula (3) include, but are not particularly limited to, cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4- or 1-cyanato-3,5-dimethylbenzene, cyanatoethylbenzene, cyanatobutylbenzene, cyanatooctylbenzene, cyanatononylbenzene, 2-(4-cyanatophenyl)-2-phenylpropane (4-a-cumylphenol cyanate), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (eugenol cyanate), methyl(4-cyanatophenyl) sulfide, 1-cyanato-3-trifluoromethylbenzene, 4-cyanatobiphenyl, 1-cyanato-2- or 1-cyanato-4-acetylbenzene, 4-cyanatobenzaldehyde, 4-cyanatobenzoic acid methyl ester, 4-cyanatobenzoic acid phenyl ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-trimethylbenzene, 1,3-dicyanato-2,4,6-trimethylbenzene, 1,3-dicyanato-5-methylbenzene, 1-cyanato or 2-cyanatonaphthalene, 1-cyanato-4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6- or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl) propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl) butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl) diphenylmethane, bis(4-cyanatophenyl)-2,2-dichloroethylene, 1,3-bis[2-(4-cyanatophenyl)-2-propyl] benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl)sulfide, bis(4-cyanatophenyl)sulfone, 4-cyanatobenzoic acid-4-cyanatophenyl ester (4-cyanatophenyl-4-cyanatobenzoate), bis-(4-cyanatophenyl)carbonate, 1,3-bis(4-cyanatophenyl) adamantane, 1,3-bis(4-cyanatophenyl)-5,7-dimethyladamantane, 1,3-bis(3-methyl-4-cyanatophenyl)-5,7-dimethyladamantane, 3,3-bis(4-cyanatophenyl)isobenzofuran-1 (3H)-one (phenolphthalein cyanate), 3,3-bis(4-cyanato-3-methylphenyl)isobenzofuran-1(3H)-one (o-cresol phthalein cyanate), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis (4-cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one, phenol novolac-based cyanic acid ester, cresol novolac-based cyanic acid ester, trisphenol novolac-based cyanic acid ester, fluorene novolac-based cyanic acid ester, phenol aralkyl-based cyanic acid ester, cresol aralkyl-based cyanic acid ester, naphthol aralkyl-based cyanic acid ester, biphenyl aralkyl-based cyanic acid ester, phenol-modified xylene formaldehyde-based cyanic acid ester, modified naphthalene formaldehyde-based cyanic acid ester, phenol-modified dicyclopentadiene-based cyanic acid ester, and phenol-based cyanic acid ester having a polynaphthylene ether structure. One of or a mixture of two or more of these other cyanic acid ester compounds can be used.

Examples of the phenol novolac-based cyanic acid ester and the cresol novolac-based cyanic acid ester include cyanation products of resins obtained by reacting phenol, alkyl-substituted phenol, or halogen-substituted phenol with a formaldehyde compound such as formalin or paraformaldehyde in an acidic solution by a method known in the art.

Examples of the trisphenol novolac-based cyanic acid ester include cyanation products of resins obtained by reacting hydroxybenzaldehyde with phenol in the presence of an acidic catalyst.

Examples of the fluorene novolac-based cyanic acid ester include cyanation products of resins obtained by reacting a fluorenone compound with a 9,9-bis(hydroxyaryl)fluorene in the presence of an acidic catalyst.

Examples of the phenol aralkyl-based cyanic acid ester, the cresol aralkyl-based cyanic acid ester, the naphthol aralkyl-based cyanic acid ester, and the biphenyl aralkyl-based cyanic acid ester include cyanation products of resins obtained by reacting a bishalogenomethyl compound represented by $Ar_2$—$(CH_2Y)_2$ with a phenol compound in the presence or absence of an acidic catalyst, resins obtained by reacting a bis(alkoxymethyl) compound represented by $Ar_2$—$(CH_2OR)_2$ or a bis(hydroxymethyl) compound represented by $Ar_2$—$(CH_2OH)_2$ with a phenol compound in the presence of an acidic catalyst, or resins obtained by polycondensing an aromatic aldehyde compound, an aralkyl compound, and a phenol compound, by a method known in the art.

Examples of the phenol-modified xylene formaldehyde-based cyanic acid ester include cyanation products of resins obtained by reacting a xylene formaldehyde resin with a phenol compound in the presence of an acidic catalyst by a method known in the art.

Examples of the modified naphthalene formaldehyde-based cyanic acid ester include cyanation products of resins obtained by reacting a naphthalene formaldehyde resin with a hydroxy-substituted aromatic compound in the presence of an acidic catalyst by a method known in the art.

Examples of the phenol-based cyanic acid ester having a polynaphthylene ether structure include cyanation products of resins obtained by dehydratively condensing a polyvalent hydroxynaphthalene compound having two or more phenolic hydroxy groups in one molecule in the presence of a basic catalyst by a method known in the art.

The content of the cyanic acid ester compound (B) is preferably 10 to 99 parts by mass, more preferably 10 to 80 parts by mass, further preferably 20 to 70 parts by mass, still further preferably 25 to 65 parts by mass, with respect to 100 parts by mass of resin solids in the resin composition.

(Maleimide Compound (C))

A compound generally known in the art can be used as the maleimide compound (C) as long as the compound has one or more maleimide groups in one molecule. Examples of the maleimide compound include, but are not particularly limited to, o-phenylene bismaleimide, m-phenylene bismaleimide, p-phenylene bismaleimide, o-phenylene biscitraconimide, m-phenylene biscitraconimide, p-phenylene biscitraconimide, 4,4'-diphenylmethane bismaleimide, bis(3,5-dimethyl-4-maleimidophenyl)methane, bis(3-ethyl-5-methyl-4-maleimidophenyl)methane, bis(3,5-diethyl-4-maleimidophenyl)methane, 2,2'-bis[4-(4-maleimidophenoxy)phenyl]propane, 4-methyl-1,3-phenylene bismaleimide, 1,6'-bismaleimido-(2,2,4-trimethyl)hexane, 4,4-diphenyl ether bismaleimide, 4,4-diphenylsulfone bismaleimide, 1,3-bis(3-maleimidophenoxy)benzene, 1,3-bis(4-maleimidophenoxy)benzene, 4,4'-diphenylmethane biscitraconimide, 2,2'-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, 4,4-diphenylmethane bismaleimide, 3,3-dimethyl-5,5-diethyl-4,4-diphenylmethane bismaleimide, 1,6-bismaleimido-(2,2,4-trimethyl)hexane, 2,2-bis[4-(4-citraconimidophenoxy)phenyl]propane, phenylmethanemaleimide, polyphenylmethanemaleimide, and prepolymers of these maleimide compounds, and prepolymers of these maleimide compounds and amine compounds. One of or a mixture of two or more of these maleimide compounds can be used.

The content of the maleimide compound (C) is preferably 10 to 99 parts by mass, more preferably 10 to 80 parts by mass, further preferably 20 to 70 parts by mass, still further preferably 30 to 60 parts by mass, with respect to 100 parts by mass of resin solids in the resin composition.

(Phenol Resin (D))

The phenol resin (D) is preferably a phenol resin having two or more hydroxy groups in one molecule, and a phenol resin generally known in the art can be used. Examples of the phenol resin include, but are not particularly limited to, bisphenol A-based phenol resins, bisphenol E-based phenol resins, bisphenol F-based phenol resins, bisphenol S-based phenol resins, phenol novolac resins, bisphenol A novolac-based phenol resins, glycidyl ester-based phenol resins, aralkyl novolac-based phenol resins, biphenyl aralkyl-based phenol resins, cresol novolac-based phenol resins, polyfunctional phenol resins, naphthol resins, naphthol novolac resins, polyfunctional naphthol resins, anthracene-based phenol resins, naphthalene skeleton-modified novolac-based phenol resins, phenol aralkyl-based phenol resins, naphthol aralkyl-based phenol resins, dicyclopentadiene-based phenol resins, biphenyl-based phenol resins, alicyclic phenol resins, polyol-based phenol resins, phosphorus-containing phenol resins, polymerizable unsaturated hydrocarbon group-containing phenol resins, and hydroxy group-containing silicone resins. One of these phenol resins can be used alone, or two or more thereof can be used in combination.

The content of the phenol resin (D) is preferably 10 to 99 parts by mass, more preferably 10 to 80 parts by mass, further preferably 20 to 70 parts by mass, still further preferably 30 to 60 parts by mass, with respect to 100 parts by mass of resin solids in the resin composition.

(Epoxy Resin (E))

A compound generally known in the art can be used as the epoxy resin (E) as long as the compound has two or more epoxy groups in one molecule. Examples of the epoxy resin include bisphenol A-based epoxy resins, bisphenol E-based epoxy resins, bisphenol F-based epoxy resins, bisphenol S-based epoxy resins, bisphenol A novolac-based epoxy resins, biphenyl-based epoxy resins, phenol novolac-based epoxy resins, cresol novolac-based epoxy resins, xylene novolac-based epoxy resins, naphthalene-based epoxy resins, naphthylene ether-based epoxy resins, anthracene-based epoxy resins, trifunctional phenol-based epoxy resins, tetrafunctional phenol-based epoxy resins, naphthalene skeleton-modified novolac-based epoxy resins, triglycidyl isocyanurate, glycidyl ester-based epoxy resins, alicyclic epoxy resins, dicyclopentadiene novolac-based epoxy resins, biphenyl novolac-based epoxy resins, phenol aralkyl novolac-based epoxy resins, naphthol aralkyl novolac-based epoxy resins, aralkyl novolac-based epoxy resins, phenol aralkyl-based epoxy resins, biphenyl aralkyl-based epoxy resins, naphthol aralkyl-based epoxy resins, dicyclopentadiene-based epoxy resins, polyol-based epoxy resins, phosphorus-containing epoxy resins, glycidylamine-based epoxy resins, compounds having an epoxidized double bond such as butadiene, compounds obtained through the reaction of hydroxy group-containing silicone resins with epichlorohydrin, and halides thereof. One of or a mixture of two or more of these epoxy resins can be used. One of these epoxy resins can be used alone, or two or more thereof can be used in appropriate combination.

Among these epoxy resins, one or more resins selected from the group consisting of a biphenyl aralkyl-based epoxy resin, a naphthylene ether-based epoxy resin, a polyfunctional phenol-based epoxy resin, and a naphthalene-based epoxy resin are preferred. By use of such an epoxy resin (E), the flame retardance and the heat resistance tend to be further improved.

The content of the epoxy resin (E) is preferably 10 to 99 parts by mass, more preferably 10 to 80 parts by mass, further preferably 20 to 70 parts by mass, still further preferably 25 to 65 parts by mass, with respect to 100 parts by mass of resin solids in the resin composition. When the content of the epoxy resin (E) falls within the range described above, the resulting cured product tends to have lower water absorbability and better moisture-absorbing heat resistance and heat resistance.

(Oxetane Resin (F))

An oxetane resin generally known in the art can be used as the oxetane resin (F). Examples of the oxetane resin include, but are not particularly limited to: oxetane; alkyloxetanes such as 2-methyloxetane, 2,2-dimethyloxetane, 3-methyloxetane, and 3,3-dimethyloxetane; and 3-methyl-3-methoxymethyloxetane, 3,3'-di(trifluoromethyl)perfluorooxetane, 2-chloromethyloxetane, biphenyl-based oxetane, and 3,3-bis(chloromethyl)oxetane. Examples of commercially available products include OXT-101 (trade name, manufactured by Toagosei Co., Ltd.) and OXT-121 (trade name, manufactured by Toagosei Co., Ltd.). One of or a mixture of two or more of these oxetane resins (F) can be used.

The content of the oxetane resin (F) is preferably 10 to 99 parts by mass, more preferably 10 to 80 parts by mass, further preferably 20 to 70 parts by mass, still further preferably 30 to 60 parts by mass, with respect to 100 parts by mass of resin solids in the resin composition.

(Benzoxazine Compound (G))

The benzoxazine compound (G) is preferably a compound having two or more dihydrobenzoxazine rings in one molecule, and a compound generally known in the art can be used. Examples of the benzoxazine compound include, but are not particularly limited to, bisphenol A-based benzoxazine BA-BXZ (trade name, manufactured by Konishi Chemical Ind. Co., Ltd.), bisphenol F-based benzoxazine BF-BXZ (trade name, manufactured by Konishi Chemical Ind. Co., Ltd.), bisphenol S-based benzoxazine BS-BXZ (trade name, manufactured by Konishi Chemical Ind. Co., Ltd.), and phenolphthalein-based benzoxazine. One of or a mixture of two or more of these benzoxazine compounds (G) can be used.

The content of the benzoxazine compound (G) is preferably 10 to 99 parts by mass, more preferably 10 to 80 parts by mass, further preferably 20 to 70 parts by mass, still further preferably 30 to 60 parts by mass, with respect to 100 parts by mass of resin solids in the resin composition.

(Compound (H) having polymerizable unsaturated group)

A compound generally known in the art can be used as the compound (H) having a polymerizable unsaturated group. Examples of the compound having a polymerizable unsaturated group include: vinyl compounds such as ethylene, propylene, styrene, divinylbenzene, and divinylbiphenyl; monohydric or polyhydric alcohol (meth)acrylates such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; and benzocyclobutene resins. One of or a mixture of two or more of these compounds having a polymerizable unsaturated group can be used. The "(meth)acrylate" conceptually encompasses acrylate and methacrylate corresponding thereto.

The content of the compound (H) having a polymerizable unsaturated group is preferably 10 to 99 parts by mass, more preferably 10 to 80 parts by mass, further preferably 20 to 70 parts by mass, still further preferably 30 to 60 parts by mass, with respect to 100 parts by mass of resin solids in the resin composition.

(Polymerization Catalyst)

The resin composition of the present embodiment may optionally comprise a compound acting as a polymerization catalyst for the cyanic acid ester compound (A), the cyanic acid ester compound (B), the maleimide compound (C), the phenol resin (D), the epoxy resin (E), the oxetane resin (F), the benzoxazine compound (G), and the compound (H) having a polymerizable unsaturated group.

Examples of the polymerization catalyst include, but are not particularly limited to: metal salts such as zinc octanoate, zinc naphthenate, cobalt naphthenate, copper naphthenate, acetylacetone iron, nickel octanoate, and manganese octanoate; phenol compounds such as phenol, xylenol, cresol, resorcin, catechol, octylphenol, and nonylphenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole, and derivatives of these imidazoles, such as adducts of carboxylic acids or acid anhydrides thereof; amine compounds such as dicyandiamide, benzyldimethylamine, and 4-methyl-N,N-dimethylbenzylamine; phosphorus compounds such as phosphine compounds, phosphine oxide compounds, phosphonium compounds, and diphosphine compounds; epoxy-imidazole adduct compounds; peroxides such as benzoyl peroxide, p-chlorobenzoyl peroxide, di-t-butyl peroxide, diisopropyl peroxycarbonate, and di-2-ethylhexyl peroxycarbonate; and azo compounds such as azobisisobutyronitrile. Commercially available products of these polymerization catalysts may be used. Examples of the commercially available products include Amicure PN-23 (trade name, manufactured by Ajinomoto Fine-Techno Co., Inc.), Novacure HX?3721 (trade name, manufactured by Asahi Kasei Corp.), and Fujicure FX?1000 (trade name, manufactured by Fuji Kasei Kogyo Co., Ltd.). One of or a mixture of two or more of these polymerization catalysts can be used.

The content of the polymerization catalyst can be appropriately adjusted in consideration of the degree of cure of resins, the viscosity of the resin composition, etc., and is not particularly limited. The content is preferably 0.005 to 10 parts by mass with respect to 100 parts by mass of resin solids in the resin composition.

(Filler (I))

The resin composition of the present embodiment may optionally comprise a filler (I).

Examples of inorganic fillers include, but are not particularly limited to: talc, baked talc, clay, baked clay, unbaked clay, kaolin, baked kaolin, mica, E glass, A glass, NE glass, C glass, L glass, D glass, S glass, M glass G20, short glass fiber (including fine glass powders such as E glass, T glass, D glass, S glass, and Q glass), hollow glass, and spherical glass; silicates such as silica, natural silica, molten silica, synthetic silica, amorphous silica, Aerosil, hollow silica, and white carbon; oxides such as titanium oxide, alumina, gibbsite, boehmite, zinc oxide, magnesium oxide, and zirconium oxide; carbonates such as calcium carbonate, magnesium carbonate, and hydrotalcite; hydroxides such as aluminum hydroxide, heat-treated products of aluminum hydroxide (which is obtained by heat-treating aluminum hydroxide and removing a portion of crystallization water), magnesium hydroxide, and calcium hydroxide; sulfates or sulfites such as barium sulfate, calcium sulfate, and calcium sulfite; borates such as zinc borate, barium metaborate, aluminum borate, calcium borate, and sodium borate; nitrides such as aluminum nitride, boron nitride, boron nitride agglomerates, silicon nitride, and carbon nitride; carbides such as silicon carbide; titanates such as strontium titanate and barium titanate; molybdenum compounds such as molybdenum oxide and zinc molybdate; and zinc stannate.

Examples of organic fillers include, but are not particularly limited to, styrene-based, butadiene-based, and acrylic rubber powders, core-shell rubber powder, silicone rubber powders, silicone composite powders, and silicone resin powders.

One of these fillers (I) can be used alone, or two or more thereof can be used as a mixture. These fillers (I) differing in shape (spherical or crushed) or size can be mixed and used at an increased content.

The filler (I) may be surface-treated in advance. Examples of the treating agent include, but are not particularly limited to, functional group-containing silanes, cyclic oligosiloxanes, organohalosilanes, and alkylsilazanes. Examples of the functional group-containing silanes include, but are not particularly limited to: aminosilane compounds such as γ-aminopropyltriethoxysilane and N-β-(aminoethyl)-γ-aminopropyltrimethoxysilane; epoxysilane compounds such as γ-glycidoxypropyltrimethoxysilane and β-(3,4-epoxycyclohexyl)ethyltrimethoxysilane; vinylsilane compounds such as γ-methacryloxypropyltrimethoxysilane and vinyl-tri(β-methoxyethoxy)silane; cationic silane compounds such as N-β-(N-vinylbenzylaminoethyl)-γ-aminopropyltrimethoxysilane hydrochloride; and phenylsilane compounds. Among these treating agents, the surface treatment of spherical silica using organohalosilanes and alkylsilazanes is suitable for hydrophobizing silica surface and is preferred from the viewpoint of the excellent dispersibility of the spherical silica in the resin composition. One of these treating agents can be used alone, or two or more thereof can be used in appropriate combination.

The content of the filler (I) is preferably 50 to 1600 parts by mass, more preferably 50 to 1200 parts by mass, further preferably 50 to 900 parts by mass, still further preferably 50 to 500 parts by mass, still further preferably 50 to 300 parts by mass, with respect to 100 parts by mass of resin solids in the resin composition. When the content of the filler (I) falls within the range described above, the heat resistance and the rate of thermal expansion tend to be further improved.

(Solvent)

The resin composition of the present embodiment may optionally comprise a solvent. In this case, the resin composition of the present embodiment can be used in a form in which at least a portion, preferably the whole of each component mentioned above is dissolved or compatibilized in an organic solvent (solution or varnish). The solvent is not particularly limited as long as at least a portion, preferably the whole of each component mentioned above can be dissolved or compatibilized therein. Examples thereof include: ketone solvents such as acetone, methyl ethyl ketone, methyl isobutyl ketone, and cyclohexanone; cellosolve solvents such as propylene glycol monomethyl ether and propylene glycol monomethyl ether acetate; ester solvents such as methyl lactate, methyl acetate, ethyl acetate, butyl acetate, isoamyl acetate, ethyl lactate, methyl methoxypropionate, and methyl hydroxyisobutyrate; alcohol solvents such as methanol, ethanol, isopropanol, and 1-ethoxy-2-propanol; amides such as dimethylacetamide and dimethylformamide; and aromatic hydrocarbons such as toluene, xylene, and anisole. One of these solvents can be used alone, or two or more thereof can be used as a mixture.

(Other Components)

In addition, the resin composition of the present embodiment may optionally contain additives known in the art such as other thermosetting resins, thermoplastic resins, flame retardant compounds, curing catalysts, curing accelerators, coloring pigments, antifoaming agents, surface adjusters, frame retardants, ultraviolet absorbers, antioxidants, photopolymerization initiators, fluorescent whitening agents, photosensitizers, dyes, pigments, thickeners, lubricants, flow modifiers, dispersants, leveling agents, brightening agents, and polymerization inhibitors. Furthermore, the resin composition of the present embodiment may optionally contain a solvent. These additives are not particularly limited as long as the additives are generally used. Examples of the flame retardant compounds include: bromine compounds such as 4,4-dibromobiphenyl; phosphoric acid ester; melamine phosphate; phosphorus-containing epoxy resins; nitrogen compounds such as melamine and benzoguanamine; oxazine ring-containing compounds; and silicone compounds. One of or a mixture of two or more of these optional additives can be used.

[Method for Producing Resin Composition]

The resin composition of the present embodiment can be produced by mixing the components mentioned above by an approach known in the art. Examples of the mixing method include, but are not particularly limited to, methods using a high-speed mixer, a Nauta mixer, a ribbon blender, a kneader, an intensive mixer, a universal mixer, a dissolver, a static mixer, or the like. For the mixing, methods for adding the cyanic acid ester compound (A), other components, and a solvent are not particularly limited.

The resin composition of the present embodiment can be cured by heat, light, or the like to obtain a cured product. The cured product can be obtained, for example, by melting the resin composition or dissolving the resin composition in a solvent, and then injecting the resultant into a mold, followed by curing under usual conditions. For heat curing, the curing temperature is preferably in the range of 120° C. to 300° C. from the viewpoint of further accelerating the curing and further suppressing the degradation of the cured product.

[Purpose]

The resin composition of the present embodiment can be used for various purposes as a cured product of the resin composition and a prepreg, a metal foil-clad laminate, a resin sheet, a printed circuit board, a material for encapsulation, a fiber-reinforced composite material, and an adhesive comprising the resin composition. The resin composition of the present embodiment can be utilized widely and effectively, for example, for various purposes such as electric and electronic materials, machine tool materials, and aeronautical materials, as an electrical insulating material, an insulating layer for printed circuit boards, a material for semiconductor packages, an encapsulation material, an adhesive, a laminating material, a resist, a buildup laminate material, or the like, and particularly, can be effectively utilized as a material for recent printed circuit boards adaptable to high integration and high density, such as information terminal equipment and communication equipment. The laminate and the metal foil-clad laminate, etc. of the present invention not only has low water absorbability but has excellent performance in terms of moisture-absorbing heat resistance and heat resistance. Therefore, its industrially practical use is very high. Hereinafter, each of these purposes will be described.

(Cured Product)

The cured product of the present embodiment is obtained by curing the resin composition. Examples of the curing method include, but are not particularly limited to, heating.

(Prepreg)

The prepreg of the present embodiment comprises a base material and the resin composition with which the base material is impregnated or coated. The prepreg can be produced by impregnating or coating an inorganic fiber base material and/or an organic fiber base material with the resin composition, followed by drying, if necessary. The base material can be appropriately selected, for use, from those known in the art according to performance required for the prepreg, for example, strength, the rate of water absorption, and the coefficient of thermal expansion. Such a prepreg can be suitably used as a structural material.

Examples of the inorganic fiber constituting the base material include, but are not particularly limited to: glass fibers such as E glass, C glass, A glass, S glass, L glass, D glass, Q glass, UN glass, NE glass, T glass, H glass, and spherical glass; and non-glass inorganic fibers such as quartz.

Examples of the organic fiber constituting the base material include, but are not particularly limited to: polyamide resin fibers such as polyamide resin fiber, aromatic polyamide resin fiber, and wholly aromatic polyamide resin fiber; polyester resin fibers such as polyester resin fiber, aromatic polyester resin fiber, and wholly aromatic polyester resin fiber; synthetic fibers such as polyimide resin fiber and fluorine resin fiber; and paper composed mainly of kraft paper, cotton linter paper, mixture paper of linter and kraft pulp, or the like.

Examples of the shape of the base material include, but are not particularly limited to, woven fabrics, nonwoven fabrics, rovings, chopped strand mats, and surfacing mats. One of these base materials can be used alone, or two or more thereof can be used in appropriate combination. The thickness of the base material is not particularly limited and is preferably in the range of 0.01 to 0.2 mm for the purpose of laminates. Particularly, a woven fabric treated by ultra-opening or compaction is preferred from the viewpoint of dimensional stability. Alternatively, a glass woven fabric surface-treated with a silane coupling agent such as epoxysilane or aminosilane is preferred from the viewpoint of moisture-absorbing heat resistance. Also, a liquid-crystal polyester woven fabric is preferred from the viewpoint of electrical properties.

The method for producing the prepreg is not particularly limited as long as the method is a method generally known in the art for producing a prepreg by combining the resin composition of the present embodiment with the base material. For example, resin varnish is prepared using the resin composition, and the prepreg can be produced by the application of a method of dipping the base material in the resin varnish; a method of coating the base material with the resin varnish using various coaters; a method of spraying the resin varnish to the base material using a spray; or the like. Among these methods, the method of dipping the base material in the resin varnish is preferred. The impregnating properties of the resin composition for the base material can thereby be improved. In the case of dipping the base material in the resin varnish, a usual impregnation or coating facility can be used. For example, a method for producing a prepreg through conversion to B-stage (semi-curing) by a method of impregnating or coating the inorganic fiber base material and/or the organic fiber base material with the resin composition varnish, followed by drying at 120 to 220° C. for approximately 2 to 15 minutes can be applied thereto. In this respect, the amount of the resin composition attached to the base material, i.e., the amount of the resin composition (including the filler (C)) with respect to the total amount of the prepreg after semi-curing, is preferably in the range of 20 to 99% by mass.

(Metal Foil-Clad Laminate)

The metal foil-clad laminate of the present embodiment comprises at least one or more layers of the prepreg, and metal foil disposed on one side or both sides of the prepreg. The metal foil-clad laminate of the present embodiment can be suitably used for a printed circuit board. Such a metal foil-clad laminate can be prepared by preparing one or more layers of the prepreg, and disposing metal (e.g., copper or aluminum) foil on one side or both sides thereof, followed by lamination molding. In this context, the metal foil used is not particularly limited as long as the metal foil is used in printed circuit board materials. Copper foil such as rolled copper foil or electrolytic copper foil is preferred. The thickness of the metal foil is preferably 2 to 70 μm, more preferably 3 to 35 μm. A usual approach for laminates and multilayer boards for printed circuit boards can be applied to molding conditions. The metal foil-clad laminate can be produced by using, for example, a multiplaten press, a multiplaten vacuum press, a continuous molding machine, or an autoclave molding machine and performing lamination molding at a temperature of 180 to 350° C. and a surface pressure of 20 to 100 kg/cm$^2$ for a heating time of 100 to 300 minutes.

Alternatively, the prepreg described above may be lamination-molded in combination with a separately prepared wiring board for an inner layer to obtain a multilayer board. The method for producing the multilayer board can involve, for example, disposing 35-μm copper foil on both sides of one prepreg mentioned above, lamination-molding the resultant under the conditions described above, then forming an inner layer circuit, carrying out the black oxide treatment of the circuit to form an inner layer circuit board, then alternately disposing this inner layer circuit board and the prepreg one by one, further disposing copper foil on the outermost layer, and lamination-molding the resultant, preferably in vacuum, under the conditions described above to prepare the multilayer board.

(Printed Circuit Board)

The printed circuit board of the present embodiment comprises an insulating layer comprising the resin composition, and a conductor layer disposed on the surface of the insulating layer. Hereinafter, one example of a method for producing the printed circuit board will be shown. First, the metal foil-clad laminate mentioned above is prepared. Next, the surface of the metal foil-clad laminate is subjected to etching treatment for the formation of an inner layer circuit to prepare an inner layer substrate. The inner layer circuit surface of this inner layer substrate is surface-treated, if necessary, for enhancing adhesion strength. Subsequently, a required number of layers of the prepreg mentioned above is put on the resulting inner layer circuit surface. Metal foil for an outer layer circuit is laterally laminated thereon, followed by integral molding by heating under increased pressure. In this way, a multilayer laminate is produced in which the insulating layer composed of the base material and a cured product of the resin composition is formed between the inner layer circuit and the metal foil for an outer layer circuit. Subsequently, this multilayer laminate is processed by hole drilling for through-holes or via holes. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

The printed circuit board obtained by the method described above has an insulating layer and a conductor layer formed on the surface of this insulating layer and is configured such that the insulating layer comprises the resin composition of the present embodiment mentioned above. Specifically, the prepreg of the present embodiment mentioned above (the base material and the resin composition of the present embodiment with which the base material is impregnated or coated) and the layer of the resin composition (the layer consisting of the resin composition of the present invention) in the metal foil-clad laminate of the present embodiment mentioned above are each constituted by the insulating layer comprising the resin composition of the present embodiment.

(Resin Sheet)

The resin sheet of the present embodiment comprises a support and a layer comprising the resin composition disposed on the surface of the support. The resin sheet can be suitably used for a film for buildup or a dry film solder resist. Such a resin sheet can be obtained by coating a support with a solution of the resin composition dissolved in a solvent, followed by drying.

Examples of the support include, but are not particularly limited to: organic film base materials such as polyethylene films, polypropylene films, polycarbonate films, polyethylene terephthalate films, ethylene-tetrafluoroethylene copolymer films, and mold release films comprising these films surface-coated with a mold release agent, and polyimide films; and plate-like inorganic film base materials such as conductor foil (e.g., copper foil and aluminum foil), glass plates, SUS plates, and FRP.

Examples of the coating method include a method of coating the support with the solution of the resin composition dissolved in a solvent using a bar coater, a die coater, a doctor blade, a baker applicator, or the like. After drying, the support may be removed from the laminated sheet by peeling or etching to prepare a monolayer sheet (resin sheet). The monolayer sheet (resin sheet) can also be obtained without the use of the support by supplying the solution of the resin composition of the present embodiment dissolved in a solvent into a mold having a sheet-like cavity, followed by drying or the like to form a sheet shape.

In the preparation of the monolayer or laminated sheet, the drying conditions for removing the solvent are not particularly limited and preferably involve a temperature of 20° C. to 200° C. for 1 to 90 minutes from the viewpoint of the residual solvent in the resin composition and the progression of cure of the resin composition. In the monolayer or laminated sheet, the resin composition may be used in an uncured state by the mere drying of the solvent or may be used, if necessary, in a semi-cured state (state converted to B-stage). The thickness of the resin layer in the monolayer or laminated sheet can be adjusted by the concentration of the solution of the resin composition of the present embodiment and a coating thickness and is not particularly limited. The thickness is preferably 0.1 to 500 μm because a larger coating thickness is generally likely to cause the solvent to remain during drying.

(Material for Encapsulation)

The material for encapsulation of the present embodiment comprises the resin composition and can be produced using the resin composition. A method generally known in the art can be appropriately applied to a method for producing the material for encapsulation and is not particularly limited. For example, the resin composition can be mixed with various additives or solvents, etc. known to be used for the production of materials for encapsulation, using a mixer known in the art to produce the material for encapsulation. For the mixing, a method generally known in the art can be appropriately applied to a method for adding the resin composition, various additives, and solvents and is not particularly limited.

(Fiber-Reinforced Composite Material)

The fiber-reinforced composite material of the present embodiment comprises the resin composition and can be produced using the resin composition and reinforcing fiber. The reinforcing fiber contained in the fiber-reinforced composite material is not particularly limited, and, for example, fiber such as carbon fiber, glass fiber, aramide fiber, boron fiber, PBO fiber, high-strength polyethylene fiber, alumina fiber, or silicon carbide fiber can be used. The form or sequence of the reinforcing fiber is not particularly limited and can be appropriately selected from, for example, woven fabrics, unwoven fabrics, mats, knits, braided cords, unidirectional strands, rovings, and chopped strands. Alternatively, a preform (laminated woven ground fabrics made of the reinforcing fiber, or an integrally sutured product thereof using stitching yarn, or a fiber structure such as a three-dimensional woven fabric or a knitted or braided fabric) may be applied to the form of the reinforcing fiber.

Specific examples of methods for producing these fiber-reinforced composite materials include liquid composite molding methods, resin film infusion methods, filament winding methods, hand lay-up methods, and pultrusion methods. Among these methods, a resin transfer molding method, which is one of the liquid composite molding methods, is adaptable to various purposes because materials other than preforms, such as a metal plate, a foam core, and a honeycomb core can be loaded in molds in advance. Therefore, the resin transfer molding method is preferably used in the large-scale production of composite materials having a relatively complicated shape in a short time.

(Adhesive)

The adhesive of the present embodiment comprises the resin composition and can be produced using the resin composition. A method generally known in the art can be appropriately applied to a method for producing the adhesive and is not particularly limited. For example, the resin composition can be mixed with various additives or solvents, etc. known to be used for the production of adhesives, using a mixer known in the art to produce the adhesive. For the mixing, a method generally known in the art can be appropriately applied to a method for adding the resin composition, various additives, and solvents and is not particularly limited.

The resin composition of the present embodiment has excellent low thermal expansibility, flame retardance, and heat resistance and is therefore very useful as a highly functional polymer material. The resin composition of the present embodiment is preferably used as a material excellent thermally, electrically, and in mechanical properties in electrical insulating materials, materials for encapsulation, adhesives, laminating materials, resists, and buildup laminate materials as well as fixation materials, structural members, reinforcing agents, templating materials, etc. in fields such as civil engineering and construction, electrical and electronics, automobiles, railroads, shipping, aircrafts, sport goods, and arts and crafts. Among others, the resin composition of the present embodiments is suitable for electrical insulating materials, semiconductor encapsulation materials, adhesives for electronic components, aircraft structural members, satellite structural members, and railroad vehicle structural members, which are required to have low thermal expansibility, flame retardance, and a high level of mechanical strength.

EXAMPLES

Hereinafter, the present embodiment will be described more specifically with reference to Examples and Comparative Examples. However, the present invention is not intended to be limited by Examples below.

(Measurement of OH Group (g/Eq.) Equivalent of Hydroxy Group-Containing Aromatic Compound)

According to JIS-K0070, the OH group equivalent (g/eq.) was determined by the pyridine-acetyl chloride method.

(Measurement of Weight-Average Molecular Weight Mw of Cyanic Acid Ester Compound)

10 μL of a solution containing 1 g of the cyanic acid ester compound dissolved in 100 g of tetrahydrofuran (solvent) was injected to high-performance liquid chromatography (high-performance liquid chromatograph Lachrom Elite manufactured by Hitachi High-Technologies Corp.), and analysis was carried out. Column: two TSKgel GMH$_{HR}$-M (30 cm long×7.8 mm in inside diameter) columns manufactured by Tosho Corp. Mobile phase: tetrahydrofuran. Flow rate: 1 mL/min. Detector: RI. The weight-average molecular weight Mw was determined by GPC with polystyrene as a standard.

Example 1

(Synthesis of Cyanic Acid Ester Compound of Binaphthol Aralkyl Resin (Hereinafter, Abbreviated to BXAPHCN))

BXAPHCN represented by the following formula (1) was synthesized as mentioned later.

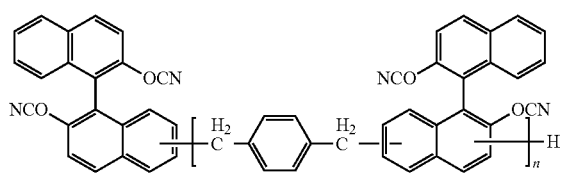

(1)

(Synthesis of Binaphthol Aralkyl Resin (Hereinafter, Abbreviated to "BXAPHOH"))

First, BXAPHOH represented by the following formula (2) was synthesized.

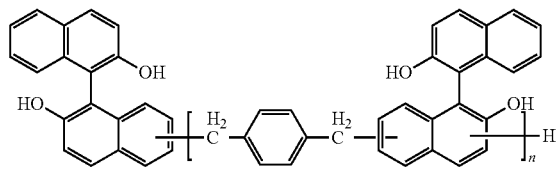

(2)

Specifically, 71.6 g of binaphthol, 13.8 g of paraxylene glycol, 128 g of methyl isobutyl ketone, 15 g of methanol, and 3.4 g of p-toluenesulfonic acid monohydrate were added, stirred, dissolved, then heated, and reacted at 70° C. for 1 hour, at 80° C. for 1 hour, and at 100° C. for 2 hours while methanol and generated water were removed. Then, the reaction solution was refluxed at 110 to 120° C. and reacted in this state for 3 hours. After the completion of the reaction, the reaction solution was cooled to 50° C., and washing with water was repeated to confirm that the aqueous phase became neutral. Subsequently, the organic phase was concentrated under reduced pressure to obtain 89 g of BXAPHOH. The obtained BXAPHOH had an OH group equivalent of 161 g/eq.

(Synthesis of BXAPHCN)

Next, 40 g (OH group equivalent: 161 g/eq.) (0.25 mol based on OH groups) of BXAPHOH (weight-average molecular weight Mw: 770; the GPC chart is shown in FIG. 1) obtained by the method described above and 25.1 g (0.25 mol) of triethylamine (1.0 mol with respect to 1 mol of the hydroxy groups) were dissolved in 220 g of dichloromethane to prepare solution 1.

24.4 g (0.40 mol) (1.6 mol with respect to 1 mol of the hydroxy groups) of cyanogen chloride, 57.0 g of dichloromethane, 37.7 g (0.37 mol) (1.5 mol with respect to 1 mol of the hydroxy groups) of 36% hydrochloric acid, and 188.7 g of water were mixed. The solution 1 was poured over 15 minutes to the obtained mixed solution with stirring while the temperature of the solution was kept at −2 to −0.5° C. After the completion of the pouring of the solution 1, the mixture was stirred at the same temperature as above for 30 minutes. Then, a solution containing 27.7 g (0.27 mol) (1.1 mol with respect to 1 mol of the hydroxy groups) of triethylamine dissolved in 27.7 g of dichloromethane (solution 2) was poured thereto over 10 minutes. After the completion of the pouring of the solution 2, the mixture was stirred at the same temperature as above for 30 minutes to complete the reaction.

Then, the reaction solution was left standing to separate an organic phase from an aqueous phase. The obtained organic phase was washed with 140 mL of 0.1 N hydrochloric acid and then washed with 140 g of water four times. The electroconductivity of a waste liquid from the fourth washing with water was 20 μS/cm to confirm that removable ionic compounds were fully removed by the washing with water.

Figure 2:
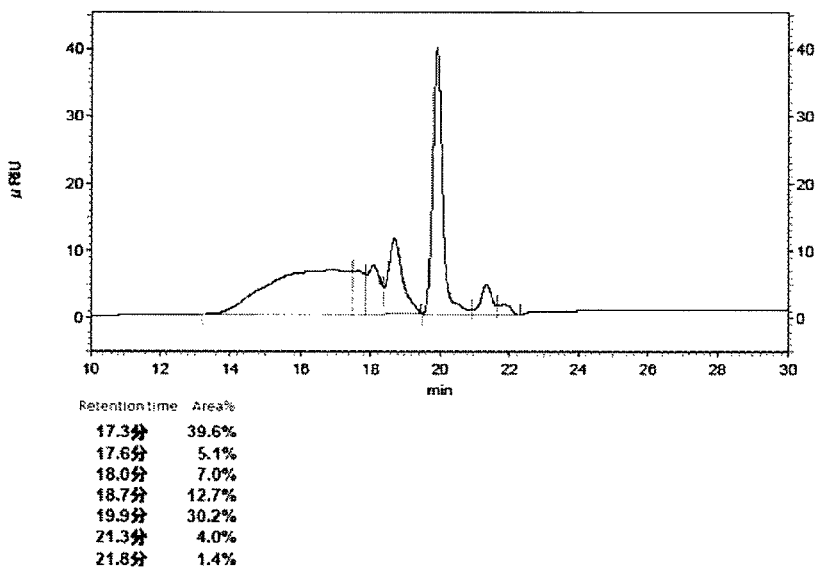
FIG. 2 shows a GPC chart of a cyanic acid ester compound BXAPHCN obtained in Example 1.
Figure 3:
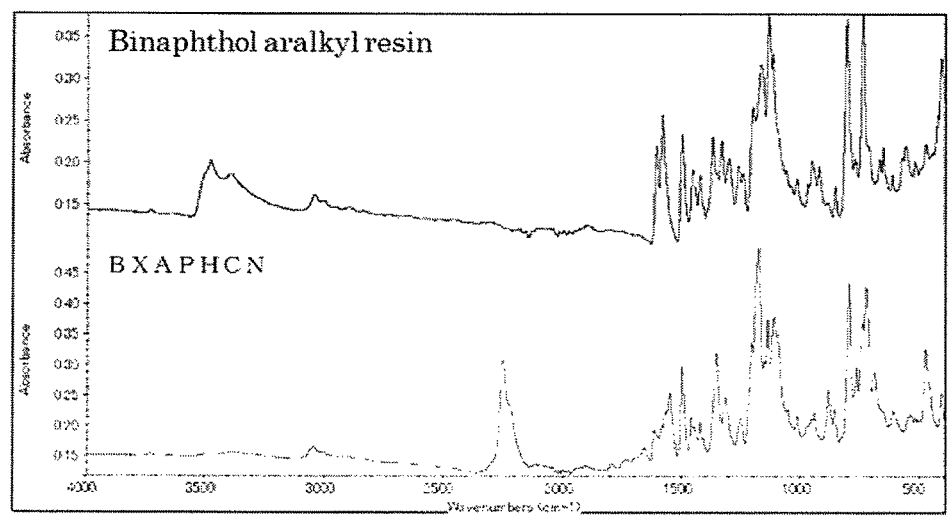
FIG. 3 shows FT-IR charts of the binaphthol aralkyl resin and the cyanic acid ester compound BXAPHCN obtained in Example 1.

The organic phase thus washed with water was concentrated under reduced pressure and finally concentrated to dryness at 90° C. for 1 hour to obtain 45.5 g of the cyanic acid ester compound BXAPHCN (black viscous substance) of interest. The obtained cyanic acid ester compound BXAPHCN had a weight-average molecular weight Mw of 2970. The GPC chart is shown in FIG. 2. The IR spectrum of BXAPHCN exhibited absorption of 2262 cm$^{-1}$ (cyanic acid ester group) and did not exhibit the absorption of hydroxy groups. The IR chart is shown in FIG. 3.

BXAPHCN was able to be dissolved at 50% by mass or more at 25° C. in methyl ethyl ketone.

Example 2

(Preparation of Resin Composition and Preparation of Cured Product)

50 parts by mass of the cyanic acid ester compound BXAPHCN obtained in Example 1 and 50 parts by mass of 2,2-bis(4-cyanatophenyl)propane (trade name: Skylex, manufactured by Mitsubishi Gas Chemical Co., Inc.) were added to a separable flask, molten by heating at 150° C. under reduced pressure using a vacuum pump, and mixed by stirring. Then, the solution was injected into the mold described in JIS-K7238-2-2009, placed in an oven, and cured by heating at 180° C. for 3 hours and then at 250° C. for 3 hours to obtain a cured product of 100 mm in one side and 2 mm in thickness.

Comparative Example 1

A cured product was obtained in the same way as in Example 2 except that 100 parts by mass of 2,2-bis(4-cyanatophenyl)propane (trade name: Skylex, manufactured by Mitsubishi Gas Chemical Co., Inc.) were used instead of 50 parts by mass of BXAPHCN in Example 2. The 2,2-bis(4-cyanatophenyl)propane Skylex was able to be dissolved at 50% by mass or more at 25° C. in methyl ethyl ketone.

The properties of each cured product obtained as described above were evaluated by the methods given below. The evaluation results are shown in Table 1.

[Glass Transition Temperature (Tg)]

According to JIS-K7244-3 (JIS C6481), the dynamic viscoelasticity of the cured product was measured using a dynamic viscoelasticity measurement apparatus (model "AR2000" manufactured by TA Instruments Japan Inc.) under conditions involving a start temperature of 30° C., an end temperature of 400° C., a temperature increase rate of 3° C./rain, and a measurement frequency of 1 Hz. The largest value of a loss elastic modulus (E") obtained in this measurement was used as the glass transition temperature. The glass transition temperature serves as an index for heat resistance.

[Coefficient of Thermal Expansion]

According to JIS-K-7197-2012 (JIS C6481), a 5 mm×5 mm×2 mm test specimen of the cured product was thermomechanically analyzed using a thermomechanical analysis apparatus (trade name "TMA/SS7100" manufactured by SII Nanotechnology Inc.) on the swelling/compression mode under conditions involving a start temperature of 30° C., an end temperature of 330° C., a temperature increase rate of 10° C./min, and a load of 0.05 N (49 mN) to measure the average amount of thermal expansion per ° C. at 60 to 120° C.

[Rate of Decrease in Mass (%)]

According to JIS-K7120-1987, the mass of a 3 mm×3 mm×2 mm test specimen was measured in a nitrogen atmosphere using a thermogravimetry-differential thermal analysis apparatus (trade name "Thermo plus EVO TG8120" manufactured by Rigaku Corp.) under conditions involving a start temperature of 40° C., an end temperature of 500° C., and a temperature increase rate of 10° C./min. The rate of decrease in mass at 500° C. was calculated according to the following expression:

Rate of decrease in mass (%)=(D-E)/D×100

D represents the mass at the start temperature, and E represents the mass at 500° C.

In this context, the flame retardance used herein is defined as a large amount of residues from thermal decomposition, i.e., a low rate of decrease in mass.

TABLE 1

| | | | Example 1 | Example 2 | Comparative Example 1 |
|---|---|---|---|---|---|
| Formulation | BXAPHCN | part by mass | 100 | 50 | 0 |
| | 2,2-Bis(4-cyanatophenyl)propane | | 0 | 50 | 100 |
| Monomer physical property | MEK solubility | % by mass | >50 | >50 | >50 |
| Physical property of cured product | Tg | ° C. | — | 310 | 300 |
| | Coefficient of thermal expansion | ppm/° C. | — | 55 | 59 |
| | Rate of decrease in mass | % | — | 43 | 44 |

As is also evident from Table 1, the cyanic acid ester compound of the binaphthol aralkyl resin of the present invention was confirmed to have excellent solvent solubility and also have excellent handleability. The cured product of a resin composition containing the cyanic acid ester compound of the present invention was confirmed to have a low rate of thermal expansion and excellent flame retardance and heat resistance as compared with a cured product obtained using the conventional cyanic acid ester compound.

Example 3

50 parts by mass of BXAPHCN obtained by Example 1, 50 parts by mass of a biphenyl aralkyl-based epoxy resin (NC-3000-FH, manufactured by Nippon Kayaku Co., Ltd.), and 100 parts by mass of molten silica (SC2050 MB, manufactured by Admatechs Co., Ltd.) were mixed to obtain varnish. This varnish was diluted with methyl ethyl ketone, and a woven fabric of E glass having a thickness of 0.1 mm was impregnated and coated with the dilution and dried by heating at 150° C. for 5 minutes to obtain a prepreg having a resin content of 50% by mass.

12 μm thick electrolytic copper foil (3EC-M3-VLP, manufactured by Mitsui Mining & Smelting Co., Ltd.) was disposed above and below eight layers of the obtained prepreg, followed by lamination molding at a pressure of 30 kgf/cm2 and a temperature of 220° C. for 120 minutes to obtain a metal foil-clad laminate having an insulating layer thickness of 0.8 mm.

Comparative Example 2

A metal foil-clad laminate having a thickness of 0.8 mm was obtained in the same way as in Example 1 except that 50 parts by mass of a bisphenol A-based cyanic acid ester compound (CA210, manufactured by Mitsubishi Gas Chemical Co., Inc.) were used instead of 50 parts by mass of BXAPHCN in Example 3.

Comparative Example 3

A metal foil-clad laminate having a thickness of 0.8 mm was obtained in the same way as in Example 3 except that 50 parts by mass of a phenol novolac-based cyanic acid ester compound (Primaset PT-30, manufactured by Lonza Japan Ltd.) were used instead of 50 parts by mass of BXAPHCN in Example 3.

The properties of each metal foil-clad laminate obtained as described above were evaluated by the methods given below. The evaluation results are shown in Table 2.

[Glass Transition Temperature (Tg)]
According to JIS C6481, the glass transition temperature was measured by DMA using a dynamic viscoelasticity analysis apparatus (model DMAQ400 manufactured by TA Instruments Japan Inc.).

[Rate of Water Absorption]
A 30 mm×30 mm sample was used. According to JIS C648, the sample was treated at 121° C. and 2 atm for 5 hours using a pressure cooker tester (model PC-3, manufactured by Hirayama Manufacturing Corp.). The rate of water absorption was measured from change in the weight of the metal foil-clad laminate between before and after the treatment.

[Moisture-Absorbing Heat Resistance]
The whole copper foil except for half the face on one side of a 50 mm×50 mm sample was removed by etching, and the resulting test specimen was treated at 121° C. and 2 atm for 5 hours using a pressure cooker tester (model PC-3, manufactured by Hirayama Manufacturing Corp.). Then, the test specimen was dipped for 60 seconds in solder of 260° C., and change in appearance was then visually observed. The number of a swollen test specimen among four test specimens was counted (the number of a swollen test specimen/the number of tested specimens).

TABLE 2

|  |  | Example 3 | Comparative Example 2 | Comparative Example 3 |
|---|---|---|---|---|
| Glass transition temperature | (° C.) | 288 | 262 | 280 |
| Rate of water absorption | 5-hr treatment | 0.33 | 0.38 | 0.52 |
| Moisture-absorbing heat resistance | 5-hr treatment | 0/4 | 3/4 | 1/4 |

As is evident from Table 2, use of the resin composition of the present invention was confirmed to be able to realize a prepreg and a printed circuit board, etc. not only having low water absorbability but having excellent moisture-absorbing heat resistance and heat resistance.

The present application is based on Japanese Patent Application Nos. 2014-255801 and 2014-255802 filed to the Japan Patent Office on Dec. 18, 2014, the contents of which are incorporated herein by reference.

INDUSTRIAL APPLICABILITY

The cyanic acid ester compound of the present invention has industrial applicability as a material that can be used for various purposes such as prepregs, metal foil-clad laminates, resin sheets, printed circuit boards, materials for encapsulation, fiber-reinforced composite materials, and adhesives.

The invention claimed is:

1. A resin composition comprising a cyanic acid ester compound (A) and 2,2-bis(4-cyanatophenyl)propane, the cyanic acid ester compound (A) having a structure represented by the following formula (1):

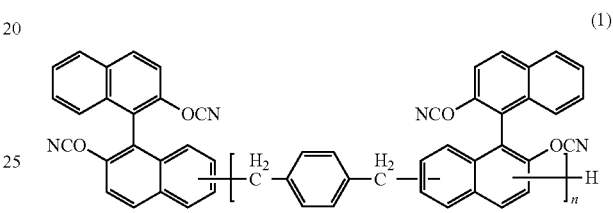

wherein n represents an integer of 1 or larger.

2. The resin composition according to claim 1, wherein the cyanic acid ester compound has a weight-average molecular weight Mw of 100 to 5000.

3. The resin composition according to claim 1, further comprising one or more components selected from the group consisting of a maleimide compound (C), a phenol resin (D), an epoxy resin (E), an oxetane resin (F), a benzoxazine compound (G), and a compound (H) having a polymerizable unsaturated group.

4. The resin composition according to claim 3, comprising an epoxy resin (E), wherein the epoxy resin (E) comprises one or more resins selected from the group consisting of a biphenyl aralkyl-based epoxy resin, a naphthylene ether-based epoxy resin, a polyfunctional phenol-based epoxy resin, and a naphthalene-based epoxy resin.

5. The resin composition according to claim 1, wherein a content of the cyanic acid ester compound (A) is 1 to 90 parts by mass with respect to 100 parts by mass of resin solids in the resin composition.

6. The resin composition according to claim 1, further comprising a filler (I).

7. The resin composition according to claim 6, wherein a content of the filler (I) is 50 to 1600 parts by mass with respect to 100 parts by mass of resin solids in the resin composition.

8. A cured product obtained by curing the resin composition according to claim 1.

9. A prepreg comprising
a base material, and
the resin composition according to claim 1 with which the base material is impregnated or coated.

10. A metal foil-clad laminate comprising one or more layers of the prepreg according to claim 9, and a metal foil disposed on one side or both sides of the prepreg.

11. A resin sheet comprising
a support, and
a layer comprising the resin composition according to claim 1 disposed on a surface of the support.

12. A printed circuit board comprising an insulating layer comprising the resin composition according to claim 1, and a conductor layer disposed on a surface of the insulating layer.

13. A material for encapsulation comprising the resin composition according to claim 1.

14. A fiber-reinforced composite material comprising the resin composition according to claim 1.

15. An adhesive comprising the resin composition according to claim 1.

* * * * *